(12) United States Patent
Chiu

(10) Patent No.: US 10,825,796 B2
(45) Date of Patent: Nov. 3, 2020

(54) SEMICONDUCTOR PACKAGE AND METHOD FOR MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/166,803

(22) Filed: Oct. 22, 2018

(65) Prior Publication Data

US 2020/0126949 A1 Apr. 23, 2020

(51) Int. Cl.
| H01L 25/065 | (2006.01) |
| H01L 23/00 | (2006.01) |
| H01L 23/31 | (2006.01) |
| H01L 25/00 | (2006.01) |

(52) U.S. Cl.
CPC ...... *H01L 25/0655* (2013.01); *H01L 23/3114* (2013.01); *H01L 23/3121* (2013.01); *H01L 24/32* (2013.01); *H01L 24/83* (2013.01); *H01L 25/50* (2013.01)

(58) Field of Classification Search
CPC . H01L 23/3114; H01L 23/3121; H01L 24/32; H01L 24/83; H01L 25/0655; H01L 25/50
See application file for complete search history.

(56) References Cited

U.S. PATENT DOCUMENTS

| 9,548,248 B2 * | 1/2017 | Pueschner | H01L 21/302 |
| 2007/0238206 A1 | 10/2007 | Aghababazadeh et al. | |
| 2008/0064137 A1 * | 3/2008 | O'Donnell | H01L 21/56 438/106 |
| 2010/0193932 A1 * | 8/2010 | Kang | H01L 21/568 257/690 |
| 2017/0103951 A1 * | 4/2017 | Lee | H01L 23/3121 |
| 2017/0194292 A1 * | 7/2017 | Yu | H01L 25/0652 |

FOREIGN PATENT DOCUMENTS

| CN | 101517719 A | 8/2009 |
| TW | 201810574 A | 3/2018 |

* cited by examiner

*Primary Examiner* — Allan R Wilson
(74) *Attorney, Agent, or Firm* — Muncy, Geissler, Olds & Lowe, P.C.

(57) ABSTRACT

The present disclosure provides a semiconductor package. The semiconductor package includes a device chip and a protecting material. The device chip has an active area and an inactive area arranged around the active area. The protecting material includes a first portion and a second portion, the first portion is disposed within the inactive area and encircles the active area, and the second portion is disposed over a lower surface of the device chip.

8 Claims, 30 Drawing Sheets

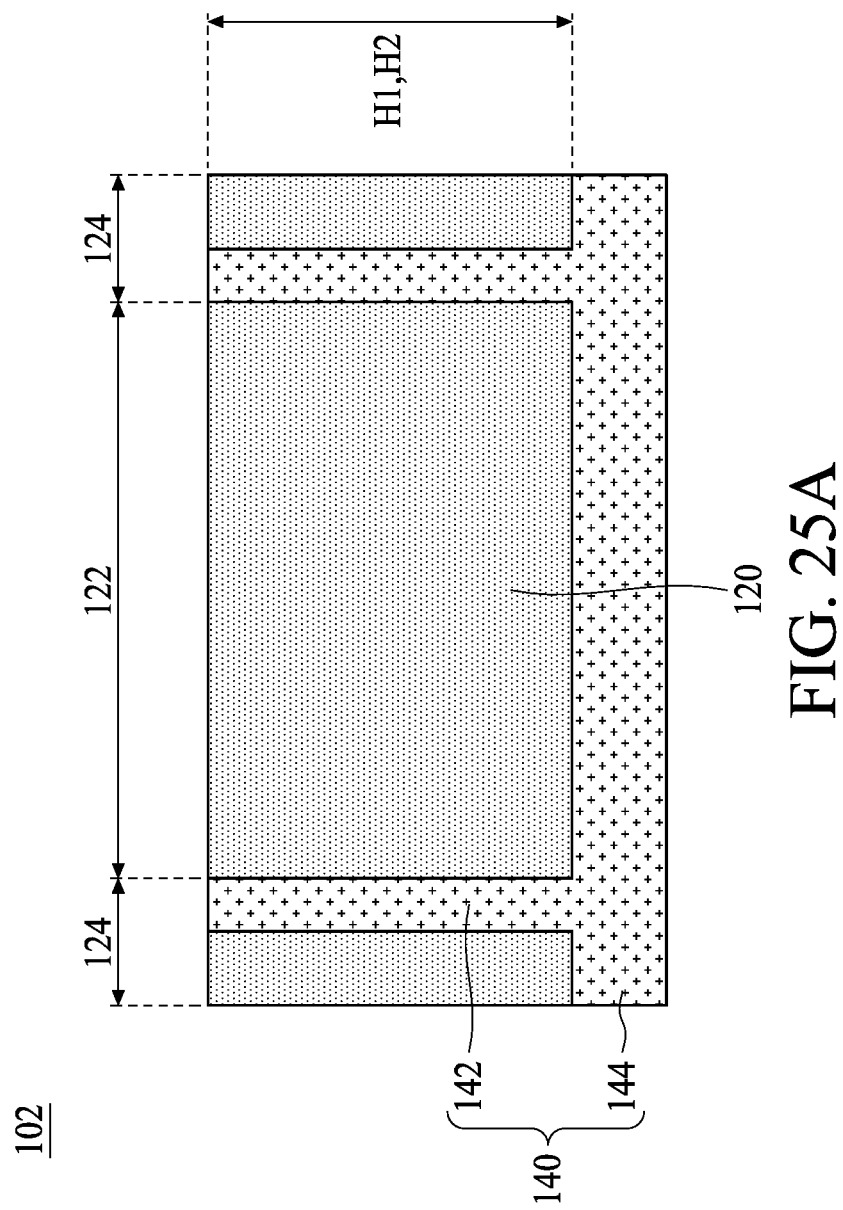

SEMICONDUCTOR PACKAGE AND METHOD FOR MANUFACTURING THE SAME

TECHNICAL FIELD

The present disclosure relates to a semiconductor device and method for manufacturing the same, and more particularly, to a semiconductor package that has five-side protection and methods for manufacturing the semiconductor package that has five-side protection.

DISCUSSION OF THE BACKGROUND

Semiconductor devices are essential for many modern applications. With the advancement of electronic technology, semiconductor devices are steadily becoming smaller in size while providing greater functionality and including greater amounts of integrated circuitry. Due to the miniaturized scale of semiconductor devices, wafer level chip scale package (WLCSP) is widely used for manufacturing.

WLCSP is a thinner chip package formed without a substrate or molding compound to be protected, and thus is prone to chip chipping or cracking during the handling and assembly processes, thereby raising reliability issues.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package. The semiconductor package includes a device chip and a protecting material. The device chip has an active area and an inactive area arranged around the active area. The protecting material includes a first portion and a second portion; the first portion is disposed within the inactive area and encircles the active area, and the second portion is disposed over a lower surface of the device chip and connected to the first portion.

In some embodiments, a height of the first portion disposed within the inactive area is substantially equal to a height of the device chip.

In some embodiments, a height of the first portion disposed within the inactive area is less than a height of the device chip.

In some embodiments, the first portion and the second portion are integrally formed.

In some embodiments, the first portion disposed within the inactive area is interfaced with the active area.

In some embodiments, the second portion fully covers the lower surface.

Another aspect of the present disclosure provides a semiconductor package assembly. The semiconductor package assembly includes a semiconductor wafer, a plurality of device chips, and a protecting material. The device chips are disposed on a front surface of the semiconductor wafer, and each of the plurality of device chips includes an active area and an inactive area arranged around the active area. The protecting material includes a first portion and a second portion connected to the first portion; the first portion is disposed within the semiconductor wafer and the inactive area and encircles the active area, and the second portion is disposed over a back surface of the semiconductor wafer and is connected to the first portion.

In some embodiments, a height of the first portion disposed within the inactive area is substantially equal to a height of each of the plurality of device chips.

In some embodiments, a height of the first portion disposed within the inactive area is less than a height of each of the plurality of device chips.

In some embodiments, the first portion and the second portion are integrally formed.

In some embodiments, the first portion disposed within the inactive area is interfaced with the active area.

In some embodiments, the second portion fully covers the back surface.

Another aspect of the present disclosure provides a method for manufacturing a semiconductor package. The method for manufacturing a semiconductor package includes steps of providing a device chip, wherein the device chip has an active area and an inactive area arranged around the active area; forming an opening within the inactive area in a lower surface of the device chip; and disposing a protecting material within the opening and over the lower surface of the device chip.

In some embodiments, the active area is exposed to the opening.

In some embodiments, the protecting material encapsulates the active area of the device chip.

In some embodiments, the method further includes steps of providing a carrier and an adhesive layer disposed over the carrier; flipping the device chip upside down before forming the openings so that front sides of the device chip face the adhesive layer and are in contact with the adhesive layer; and removing the carrier and the adhesive layer after disposing the protecting layer within the opening and over the lower surface of the device chip.

In some embodiments, the adhesive layer is exposed to the opening.

Another aspect of the present disclosure provides a method for manufacturing a semiconductor package assembly. The method includes steps of providing semiconductor wafer having a plurality of device chips disposed thereon, wherein each of the plurality of device chips has an active area and an inactive area arranged around the active area; forming a plurality of the openings, wherein each of the plurality of openings is formed in a back surface of the semiconductor wafer and forms an opening into the inactive area; and disposing a protecting material within the openings and over the back surface of the semiconductor wafer.

In some embodiments, the active area is exposed to each of the plurality of openings.

In some embodiments, the protecting material encircles the active area.

In some embodiments, the method further includes steps of providing a carrier and an adhesive layer disposed over the carrier, flipping the semiconductor wafer having the device chip disposed thereon upside down before forming the openings, so that front sides of the device chip face the adhesive layer and are in contact with the adhesive layer; and removing the carrier and the adhesive layer after disposing the protecting layer within the openings and over the back surface of the semiconductor wafer.

In some embodiments, the adhesive layer is exposed to the opening.

In some embodiments, the second portion fully covers the back surface.

With the above-mentioned configurations of semiconductor package and semiconductor package assembly, the active area of the device chip is protected by the protecting material, thus preventing cracking of the active area during the handling or assembly processes.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 21, 22A, 22B, 23A, 23B, 24A, 24B, 25A, and 25B illustrate cross-sectional views of intermediate stages in the formation of a semiconductor package in accordance with some embodiments of the present disclosure.

DETAILED DESCRIPTION

Figure 1:
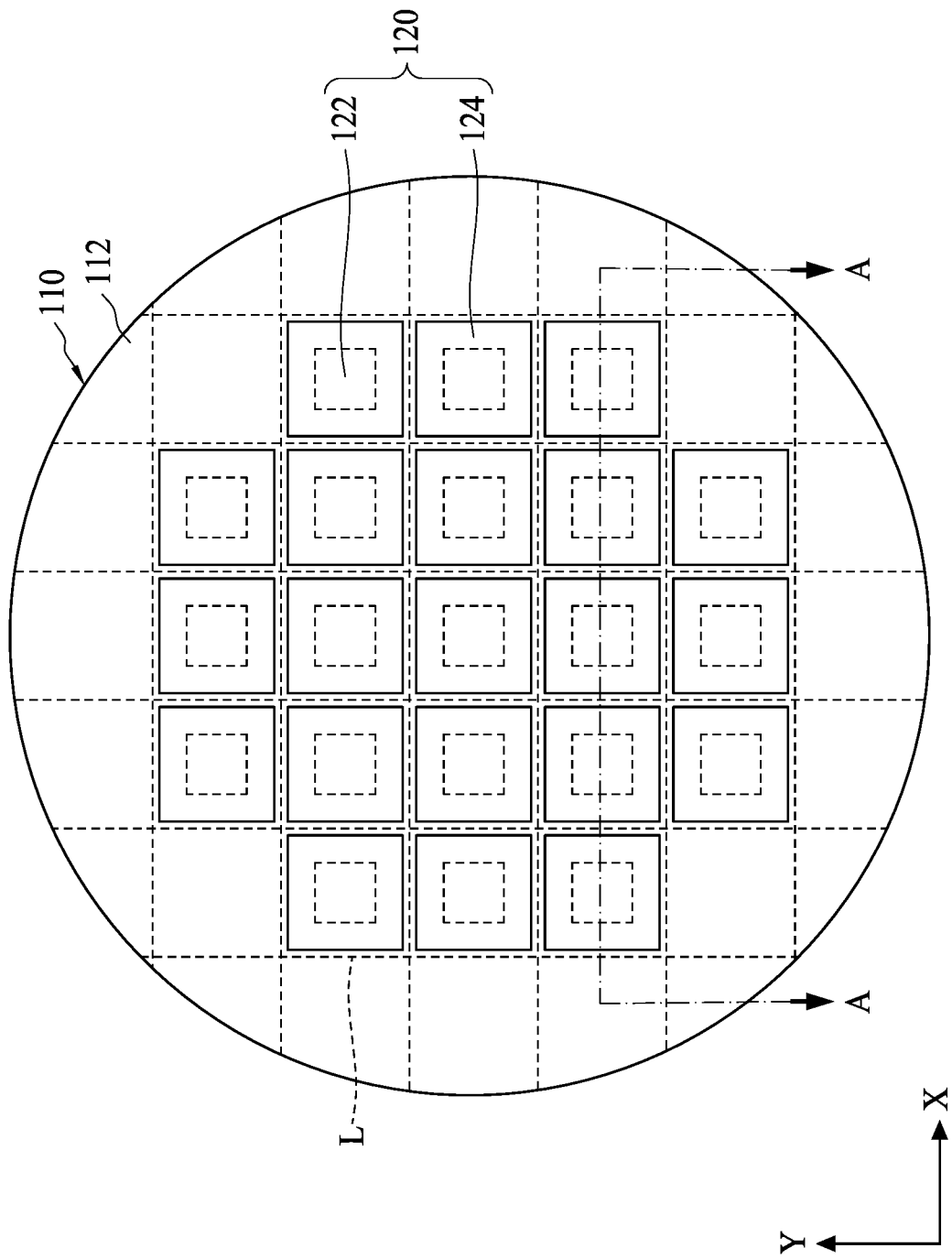
FIG. 1 illustrates a top view of an intermediate stage in the formation of a semiconductor package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIGS. 1 to 11 are schematic diagrams of intermediate stages in the formation of a semiconductor package in accordance with some embodiments of the present disclosure. The steps shown in FIGS. 1 through 11 are also illustrated schematically in the process flow shown in FIG. 12. In the subsequent discussion, the process steps shown in FIGS. 1 through 11 are discussed in reference to the process steps in FIG. 12.

Figure 2:
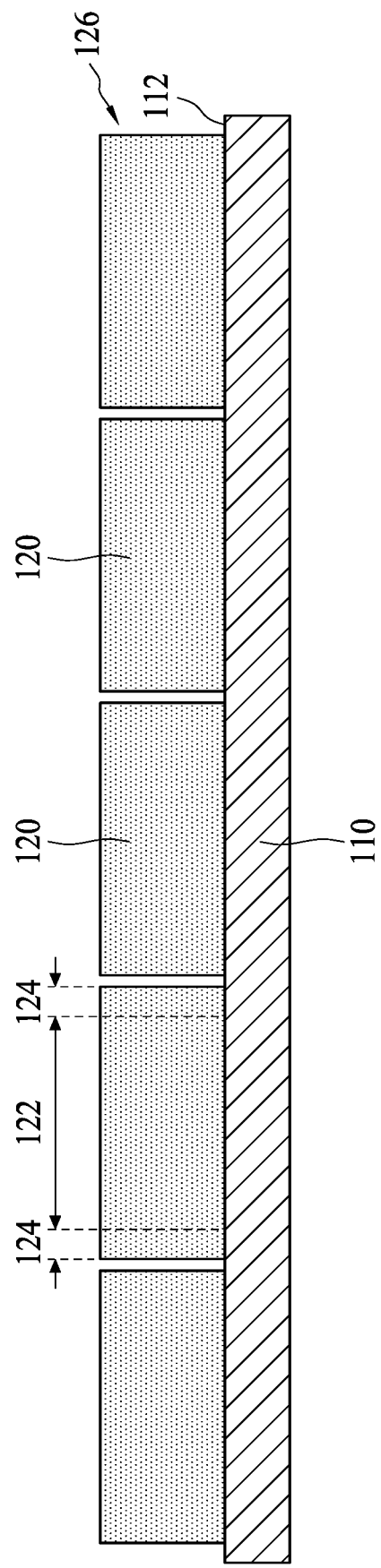
FIG. 2 is a cross-sectional view taken along the line A-A illustrated in FIG. 1.
Figure 12:
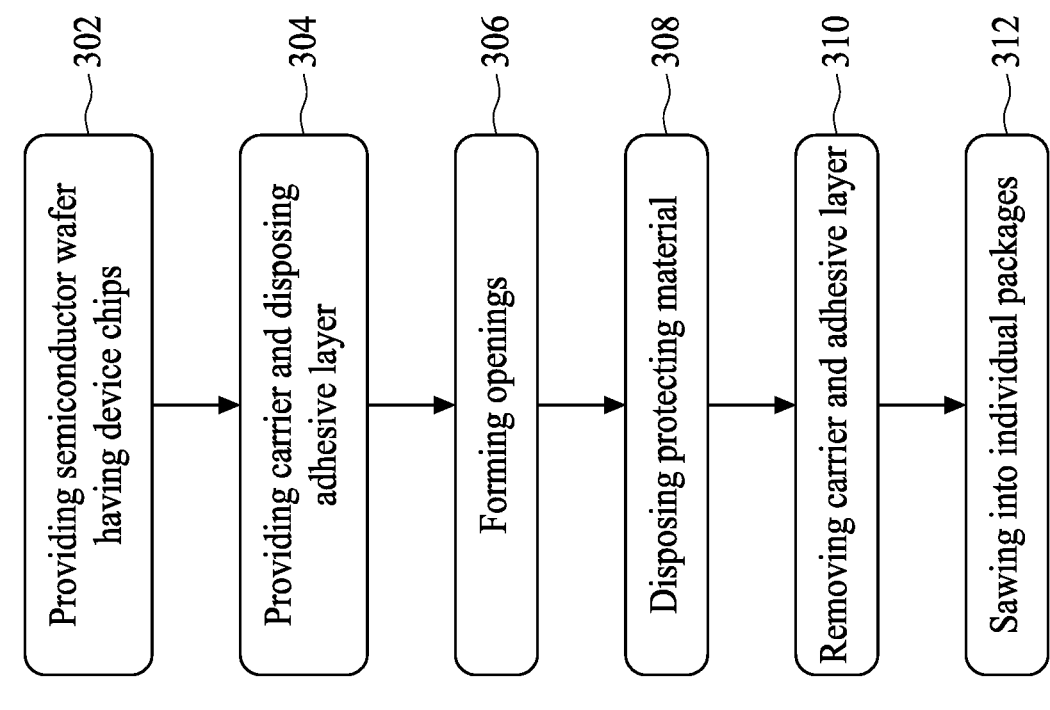
FIG. 12 illustrates a process flow for forming a semiconductor package in accordance with some embodiments of the present disclosure.

Referring to FIGS. 1 and 2, a semiconductor wafer 110 having a plurality of device chips 120 disposed thereon is provided according to a step 302 in FIG. 12. The device chips 120 are disposed on a front surface 112 of the semiconductor wafer 110. The device chips 120 define a plurality of sawing lines L, and each of the plurality of device chips 120 includes an active area 122 and an inactive area 124 arranged around the active area 122.

In some embodiments, the device chips 120 are arranged at regular intervals in a horizontal direction X and a vertical direction Y, and the sawing lines L are in a vertical and horizontal arrangement. In some embodiments, the sawing lines L are formed to define the regions that will be sawed during a sawing process to dice the semiconductor wafer 110. In some embodiments, the semiconductor wafer 110 is singulated using a laser cutting tool or saw blade. In some embodiments, the active area 122 is a functional area of the device chip 120 that contains a plurality of layers or films formed by a series of process of steps including doping, deposition, photolithography, etching, and planarization, while the inactive area 124 is a non-functional area of the device chip 120 that contains one or more layers or films formed by one or more steps including doping, deposition, photolithography, etching, and planarization.

Figure 3:
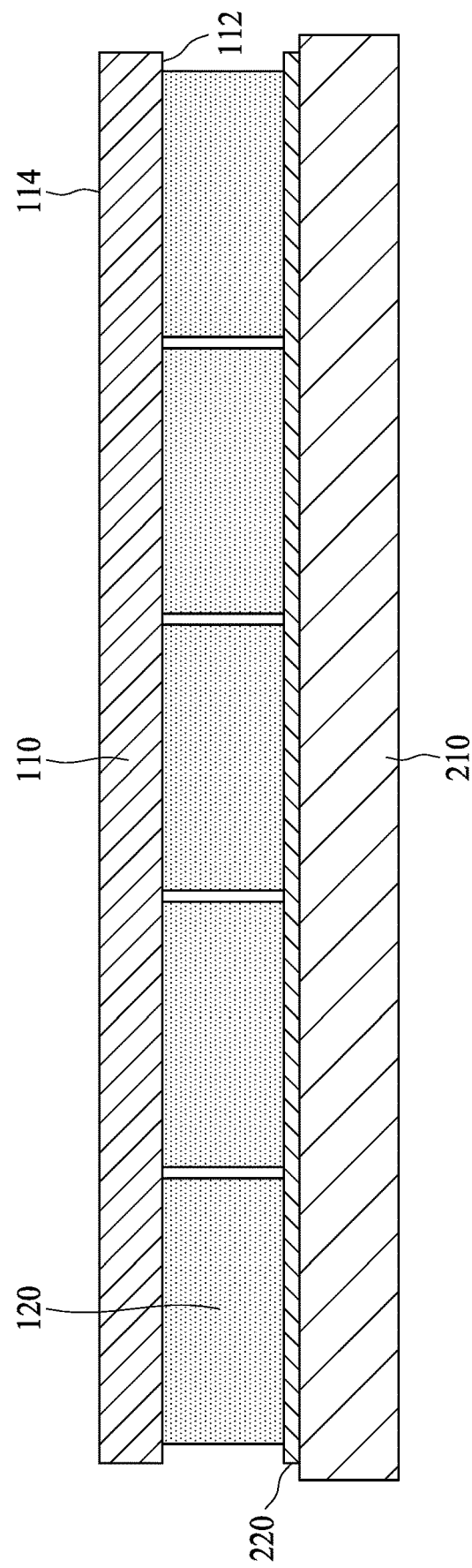
FIGS. 3 through 5 illustrate cross-sectional views of intermediate stages in the formation of the semiconductor package in accordance with some embodiments of the present disclosure.

Referring to FIG. 3, a carrier 210 and an adhesive layer 220 are provided according to a step 304 in FIG. 12. The adhesive layer 220 is disposed over the carrier 210. The semiconductor wafer 110 that has the device chips 120 disposed thereon shown in FIG. 2 is flipped upside down, so that front sides 126 of the device chips 120 face down and are in contact with the adhesive layer 220. In some embodiments, the carrier 210 is a blank glass carrier, a blank ceramic carrier, or the like, and has a round shape when viewed from above. In some embodiments, the adhesive layer 220 can be decomposed when exposed to heat or light, and hence the adhesive layer 220 can release the carrier 210 from the device chips 120.

Figure 4:
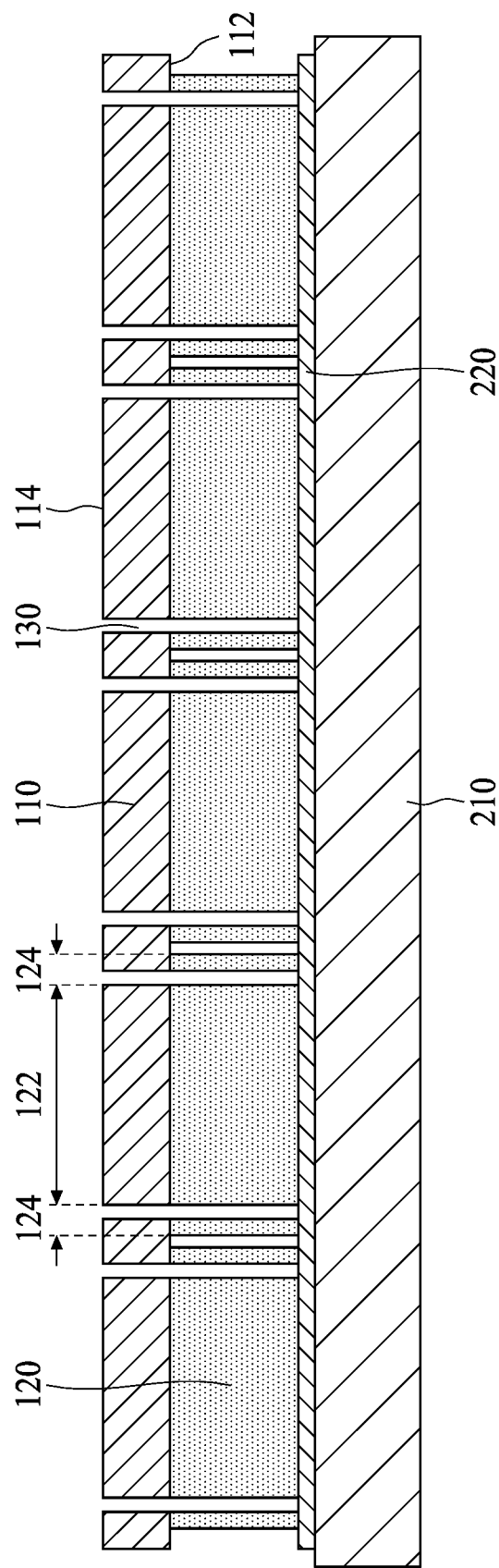

Referring to FIG. 4, a plurality of openings 130 are formed through the semiconductor and to the inactive area 124, through which some portions of the adhesive layer 220 are exposed according to a step 306 in FIG. 12. In some embodiments, each of the plurality of openings 130 formed on the inactive area 124 surrounds the active area 122. In some embodiments, the active area 122 of each of the device chips 120 is exposed to the opening 103. In some embodiments, portions of the semiconductor wafer 110 and the device chips 120 are removed to form the openings 130 by photolithography and etching processes or any other suitable processes. In some embodiments, a photo resist is first disposed over a back surface 114 of the semiconductor wafer 110, and is then patterned using a photolithography mask; next, an etching step is performed to remove the exposed portion of the semiconductor wafer 110 and the device chips 120 disposed on the exposed portion of the semiconductor wafer 110. As a result of the etching of the semiconductor wafer 110 and device chips 120, the portions of the adhesive layer 220 and the active area 122 are exposed.

Figure 5:
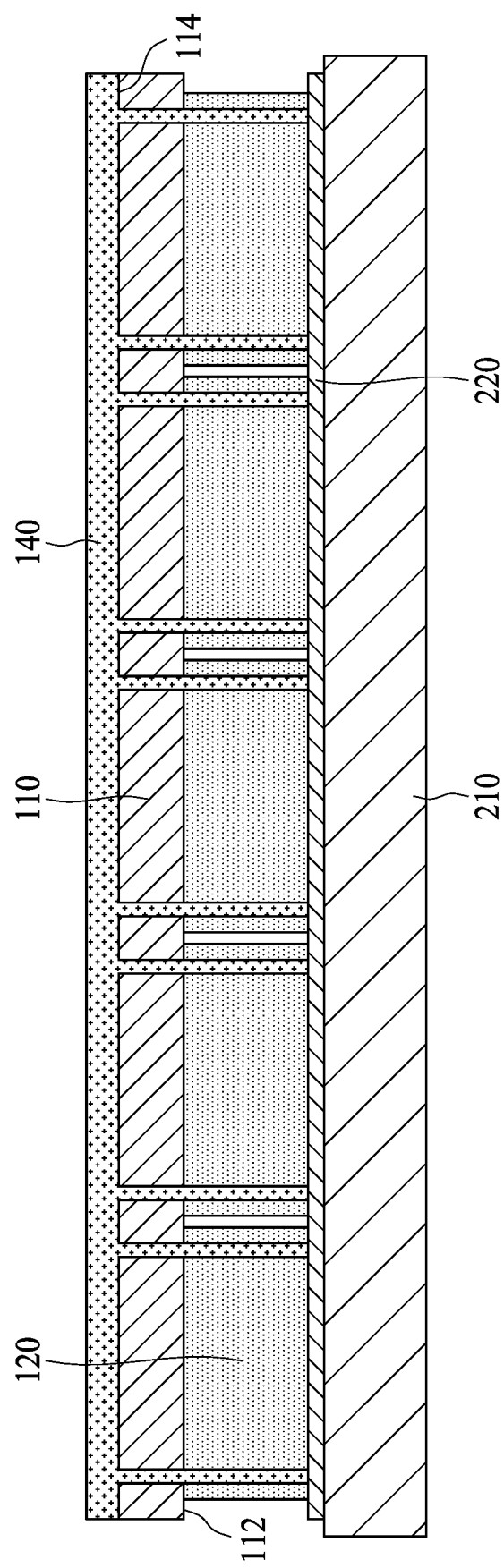

Referring to FIG. 5, a protecting material 140 is encapsulated on the back surface 114 of the semiconductor wafer 110 and fills the openings 130 according to a step 308 in FIG. 12, so that the back surface 114 of the semiconductor wafer 110 and the active area 122 of the device chip 120 are encapsulated by the protecting material 140. In some embodiments, the protecting material 140 is disposed to a thickness sufficient to fill the openings 130. In some embodiments, the protecting material 140 fills the openings 130 disposed within the inactive area 124, and the protecting material 140 is interfaced with the active area 122. In some embodiments, the protecting material 140 includes polyimide. In some embodiments, a planarization step such as a chemical mechanical polish (CMP) step is performed to planarize the protecting material 140; due to the planarization, a surface 142 of the protecting material 140, away from the device chip 120, is a smooth surface.

Figure 6:
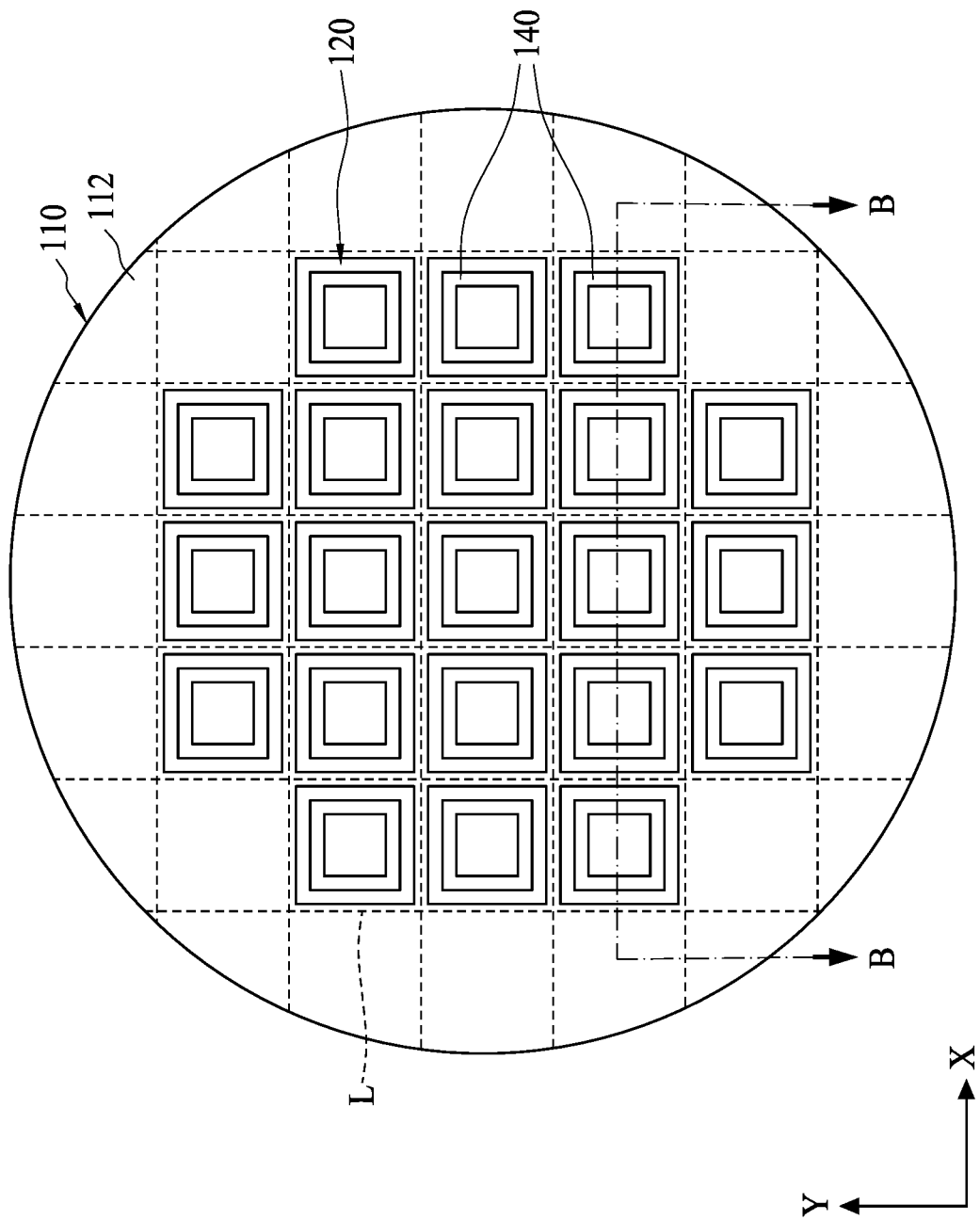
FIG. 6 illustrates a top view of an intermediate stage in the formation of the semiconductor package in accordance with some embodiments of the present disclosure.
Figure 7:
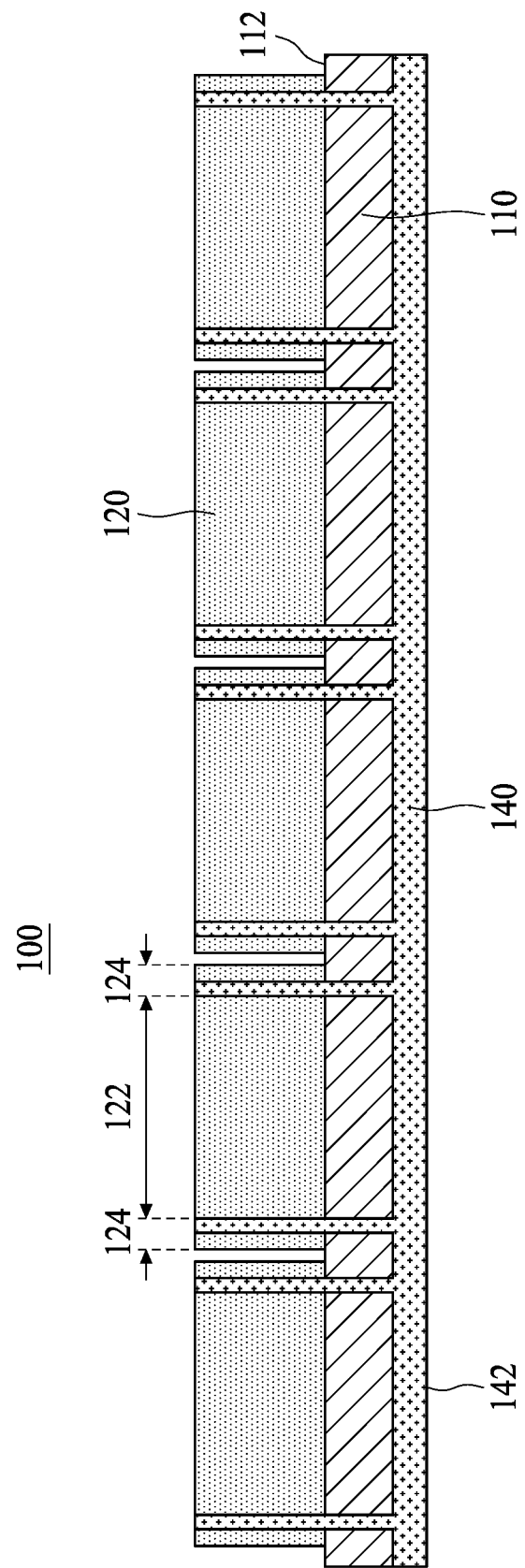
FIG. 7 illustrates a cross-sectional view taken along the line B-B illustrated in FIG. 6.
Figure 8:
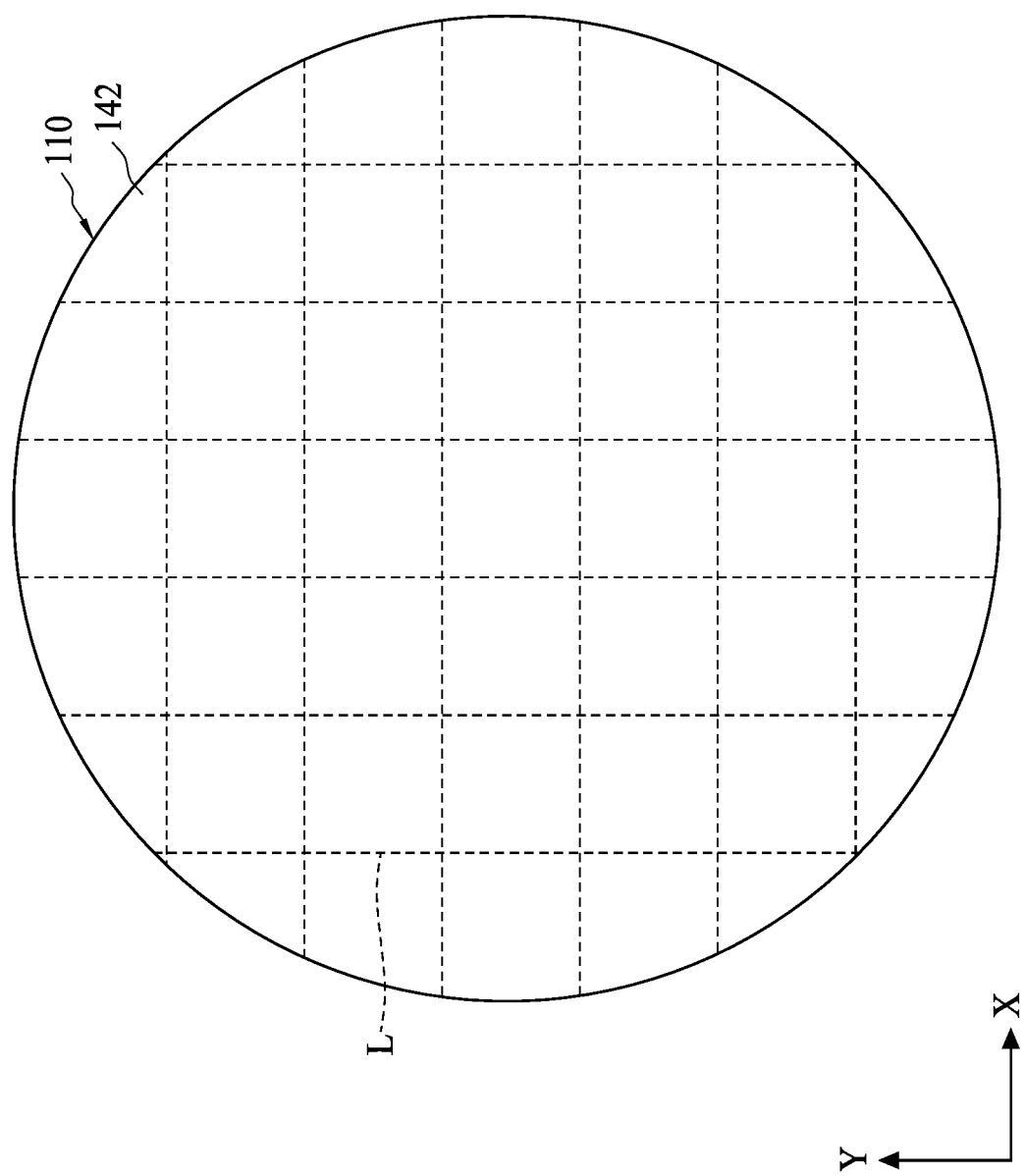
FIG. 8 illustrates a bottom view of the intermediate stage in the formation of the semiconductor package in accordance with some embodiments of the present disclosure.

Referring to FIGS. 6 to 8, the carrier 210 is removed to form a semiconductor package assembly 100 according to a step 310 in FIG. 12. In some embodiments, the carrier 210 is removed from the device chips 120 such that the device chips 120 are released from the carrier 210. In some embodiments, the semiconductor wafer 110 that has the device chips 120 disposed thereon is flipped prior to or after removal of the carrier 210. In some embodiments, the carrier 210 is reusable such that the carrier 210 can be used again after removal. In some embodiments, the carrier 210 can be used again; for example, the carrier 210 can repeatedly implement the steps 304, 306, and 308 shown in FIG. 12 to manufacture an intermediate structure, as shown in FIGS. 6 to 8.

Figure 9:
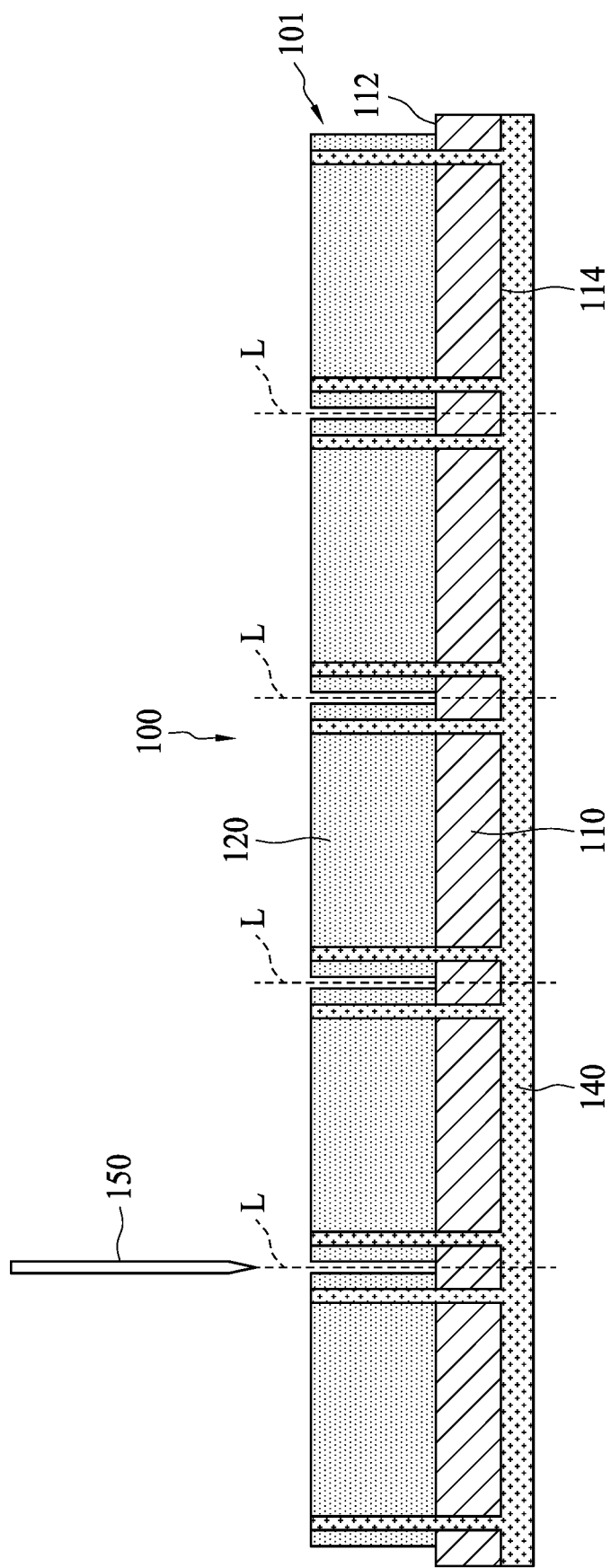
FIG. 9 illustrates a cross-sectional view of an intermediate stage in the formation of the semiconductor package in accordance with some embodiments of the present disclosure.
Figure 10:
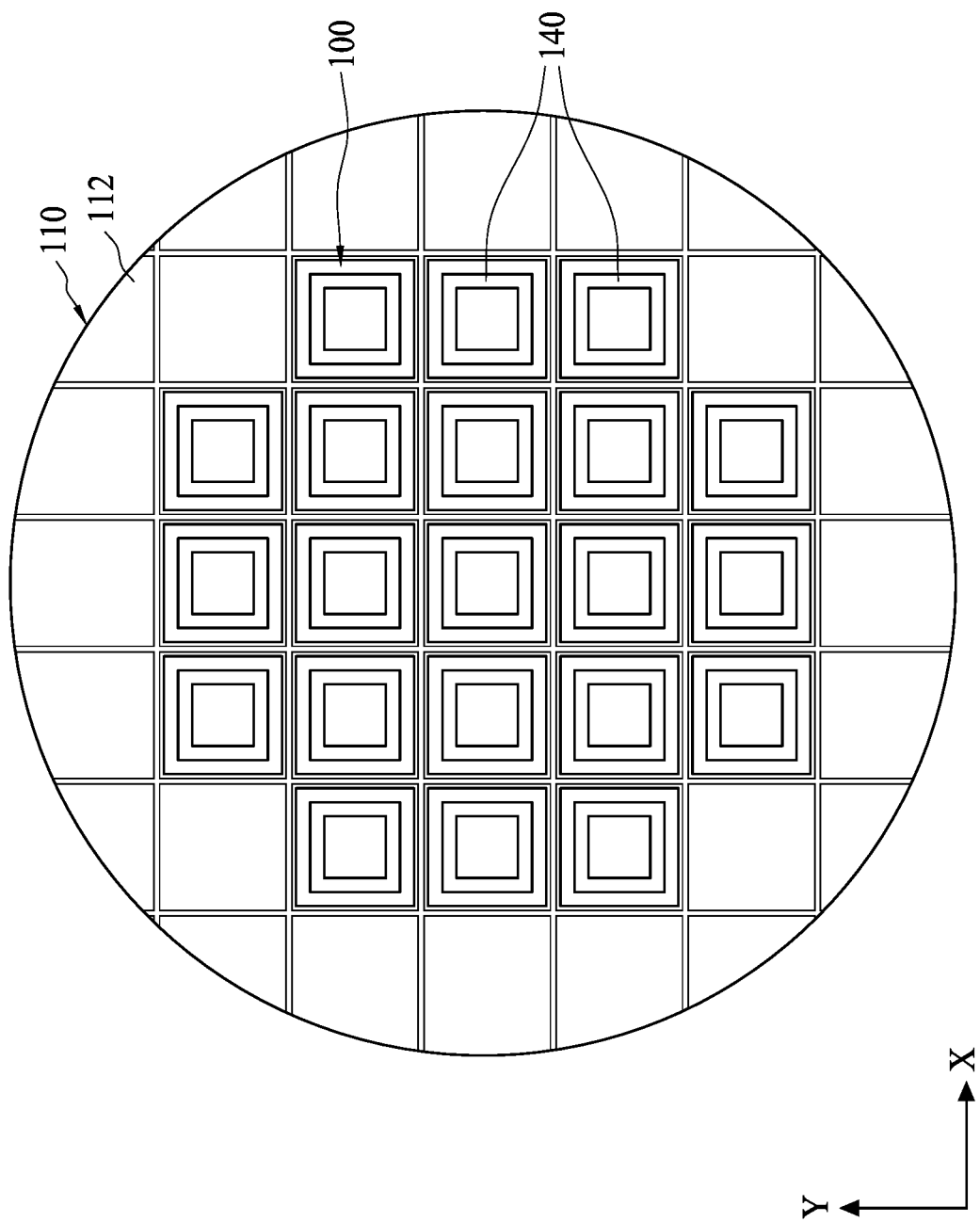
FIG. 10 illustrates a top view of an intermediate stage in the formation of the semiconductor package in accordance with some embodiments of the present disclosure.

Referring to FIGS. 9 and 10, the semiconductor package assembly 100 is sawed apart into a plurality of semiconductor packages 102 according to a step 312 in FIG. 12; each of the plurality of semiconductor packages 102 includes one of the device chips 120 and the corresponding semiconductor wafer 110 and protecting material 140. In some embodiments, the sawing step is performed, as shown in FIG. 9, using a saw blade 150. In some embodiments, the sawing is aligned with the sawing lines L. In some embodiments, the sawing step is performed from a front side 101 of the semiconductor package assembly 100. In some embodiments, after the sawing step, the semiconductor packages 102 on the left side of the illustrated sawing line L are fully separated from the semiconductor packages 102 on the right side of the illustrated sawing line L.

Figure 11:
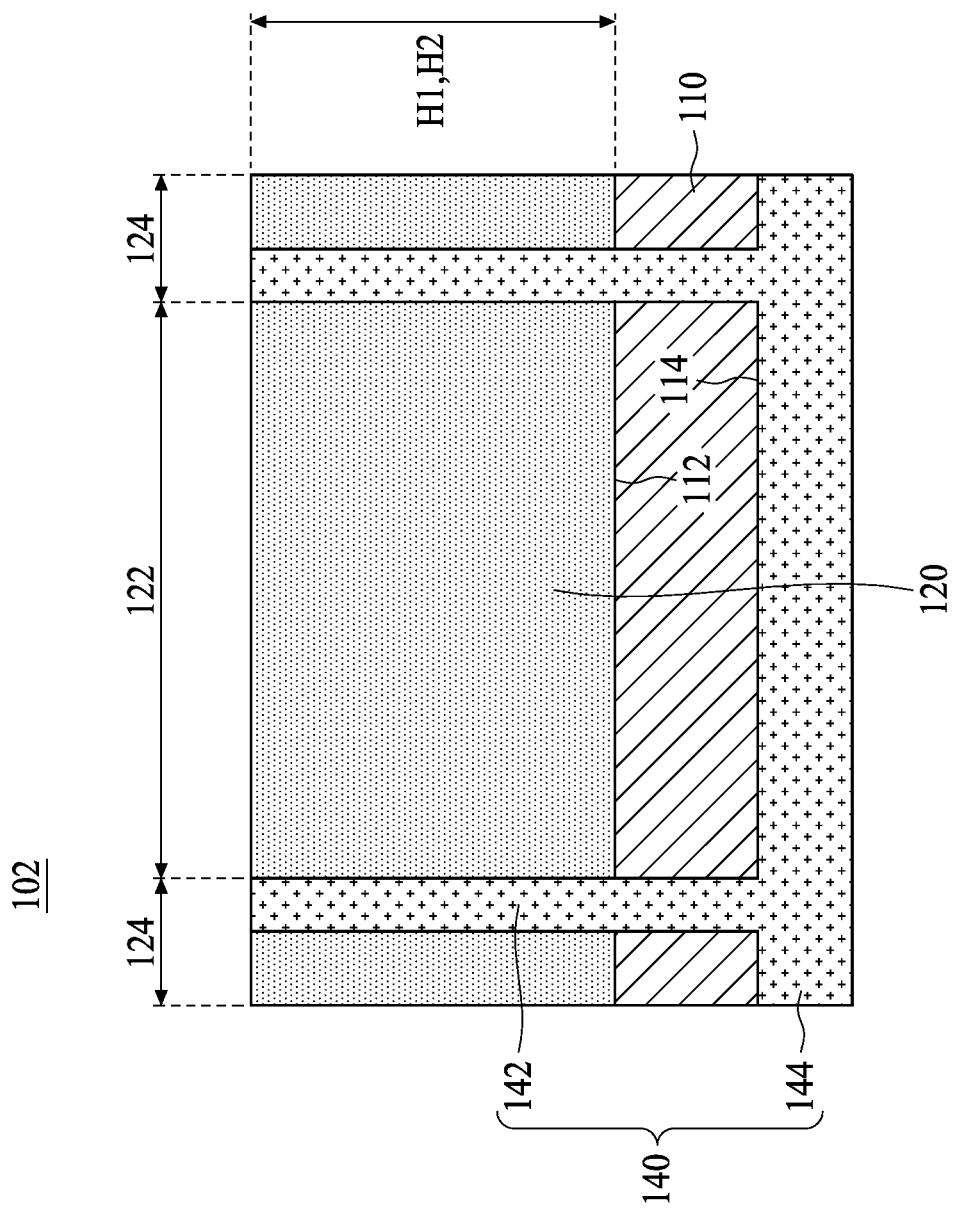
FIG. 11 illustrates a cross-sectional view of an intermediate stage in the formation of the semiconductor package in accordance with some embodiments of the present disclosure.

Referring to FIG. 11, the semiconductor package 102 includes a semiconductor wafer 110, a device chip 120 disposed on the semiconductor wafer 110, and a protection material 140 disposed over a back surface 114 of the semiconductor wafer 110 and within an inactive area 124 arranged around an active area 122 of the device chip 120.

In some embodiments, the device chip 120 is disposed on a front surface 112 of the semiconductor wafer 110 and includes the active area 122 and the inactive area 124. In some embodiments, the protecting material 140 includes a first portion 142 and a second portion 144 connected to the first portion 142; the first portion 142 is disposed within the semiconductor wafer 110 and the inactive area 124 and encircles the active area 122, and the second portion 144 is disposed over the back surface 114 of the semiconductor wafer 110. In some embodiments, the first portion 142 and the second portion 144 are integrally formed. In some embodiments, the second portion 144 fully covers the back surface 114.

In some embodiments, a height H1 of the first portion 142 disposed within the inactive area 124 is substantially equal to a height H2 of the device chip 120. In some embodiments, the protecting material 140 disposed within the inactive area 124 is interfaced with the active area 122. In some embodiments, the protecting material 140 disposed within the inactive area 124 is in contact with the active area 122. In some embodiments, the semiconductor wafer 110 is a silicon wafer.

FIGS. 13 to 19 are schematic diagrams of intermediate stages in the formation of a semiconductor package in accordance with some embodiments of the present disclosure. The steps shown in FIGS. 13 through 19 are also illustrated schematically in the process flow shown in FIG. 20. In the subsequent discussion, the process steps shown in FIGS. 13 through 19 are discussed in reference to the process steps in FIG. 20.

Figure 13:
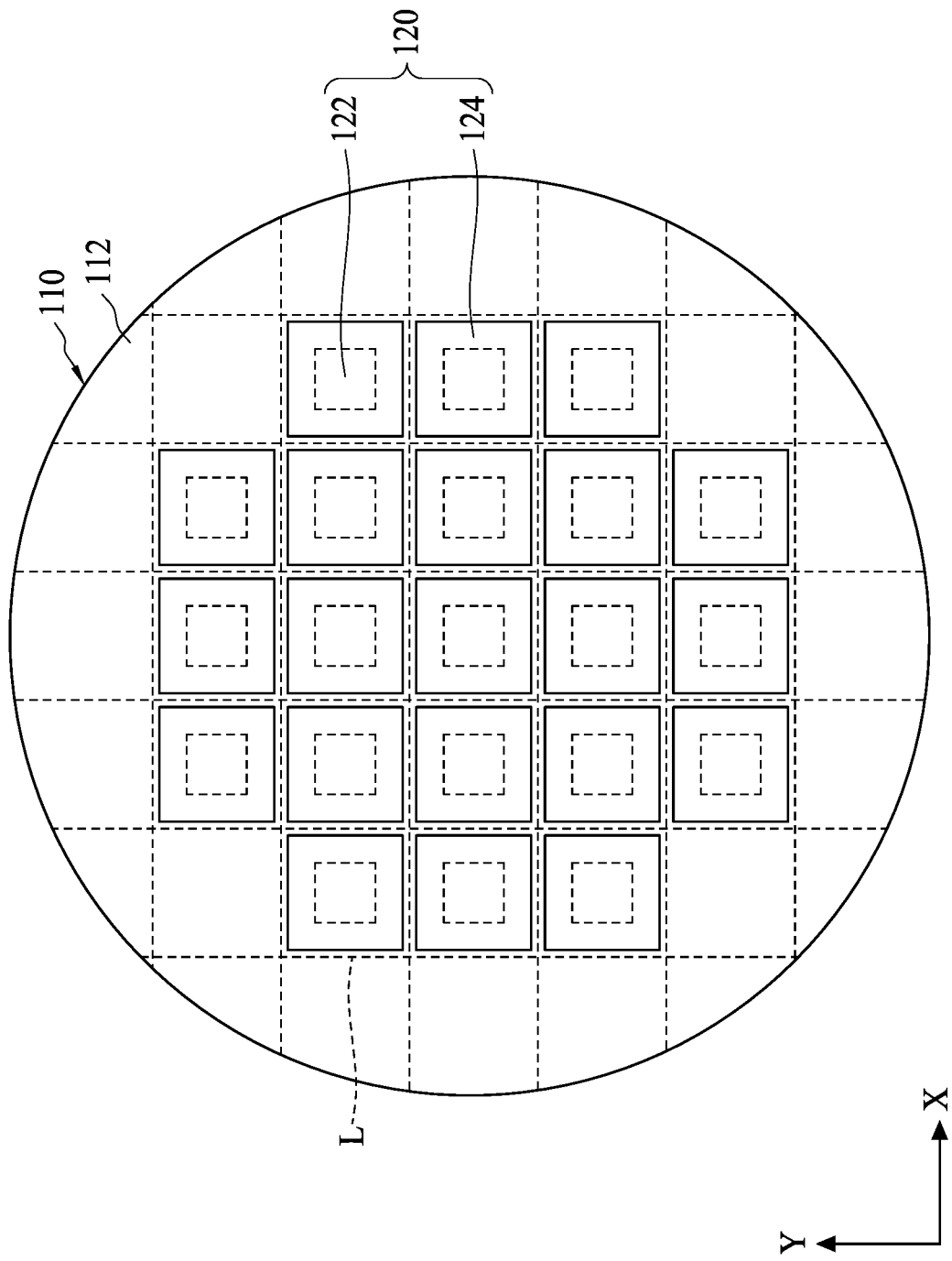
FIG. 13 illustrates a top view of an intermediate stage in the formation of a semiconductor package in accordance with some embodiments of the present disclosure.
Figure 20:
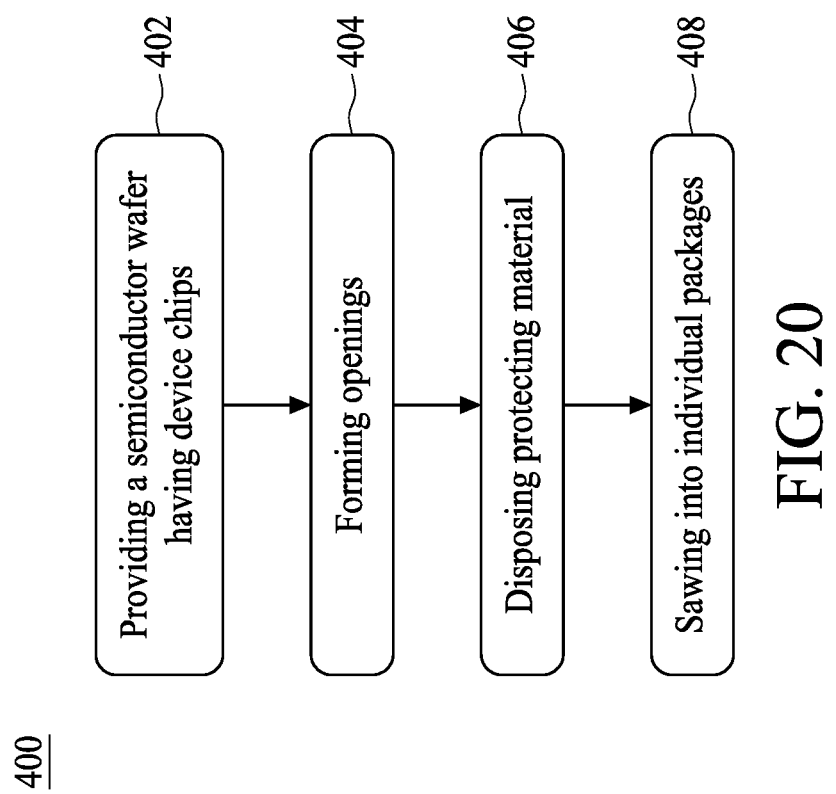
FIG. 20 illustrates a process flow for forming a semiconductor package in accordance with some embodiments of the present disclosure.

Referring to FIG. 13, a semiconductor wafer 110 having a plurality of device chips 120 disposed thereon is provided according to a step 402 in FIG. 20. The device chips 120 are disposed on a front surface 112 of the semiconductor wafer 110 and arranged at regular interval in a horizontal direction X and a vertical direction Y and define a plurality of sawing lines L in a vertical and horizontal arrangement. Each of the plurality of device chips 120 includes an active area 122 and an inactive area 124 arranged around the active area 122.

In some embodiments, the semiconductor wafer 110 is singulated using a laser cutting tool or saw blade. In some embodiments, the active area 122 is a functional area of the device chip 120 that contains a plurality of layers or films formed by a series of process of steps including doping, deposition, photolithography, etching, and planarization, while the inactive area 124 is a non-functional area of the device chip 120 that contains one or more layers or films formed by one or more steps including doping, deposition, photolithography, etching, and planarization. In some embodiments, the semiconductor wafer 110 is a silicon wafer.

Figure 14:
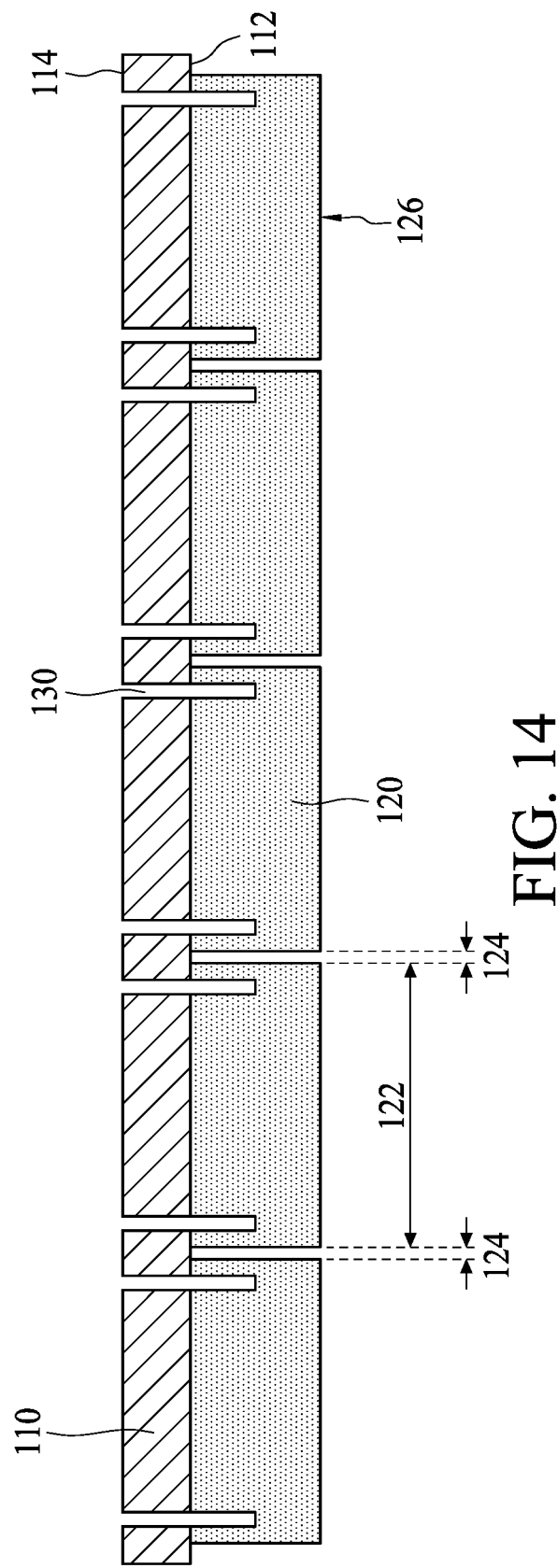
FIGS. 14 and 15 illustrate cross-sectional views of intermediate stages in the formation of the semiconductor package in accordance with some embodiments of the present disclosure.

Referring to FIG. 14, the semiconductor wafer 110 that has the device chips 120 disposed thereon is flipped upside down, so that front sides 126 of the device chips 120 face down. A plurality of openings 130 are formed within the semiconductor wafer 110 and the inactive area 124 of the device chip 120 in a back surface 114 of the semiconductor wafer 110 according to a step 404 in FIG. 20. In some embodiments, each of the plurality of openings 130 formed on the inactive area 124 surrounds the active area 122. In some embodiments, portions of the active area 122 are exposed to the opening 130.

Figure 15:
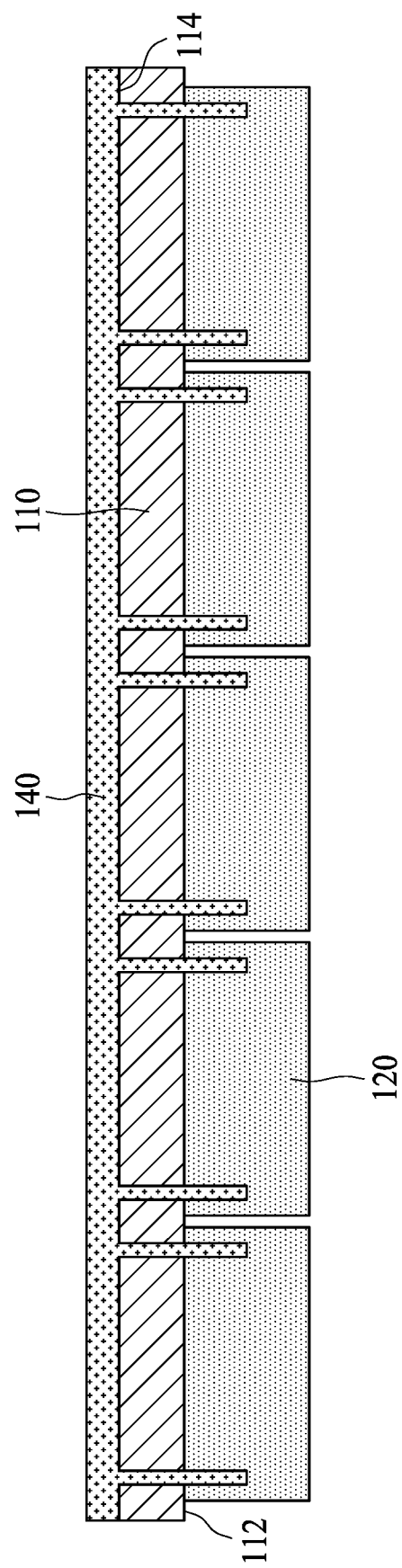
Figure 16:
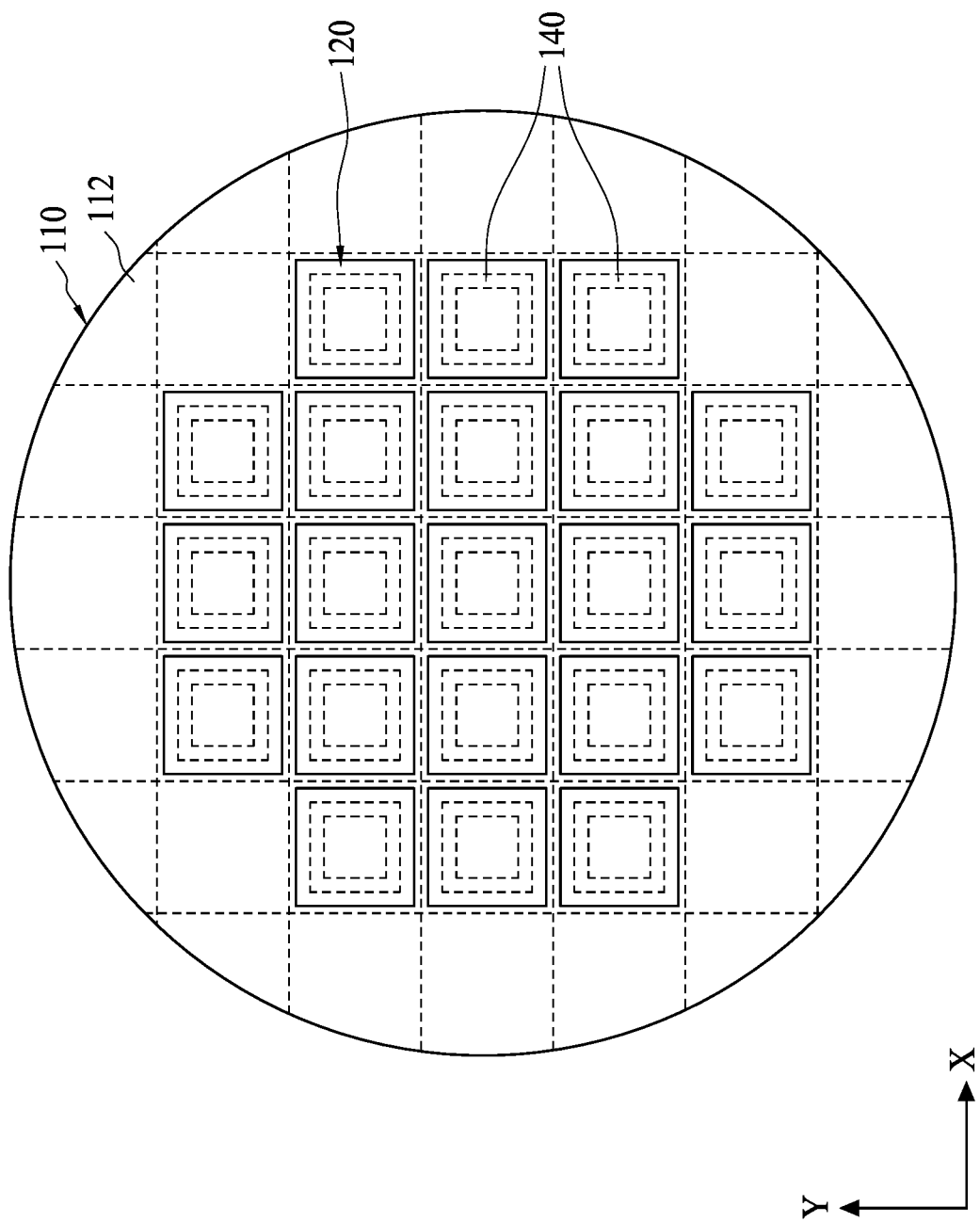
FIG. 16 illustrates a top view of an intermediate stage in the formation of the semiconductor package in accordance with some embodiments of the present disclosure.

Referring to FIGS. 15 and 16, a protecting material 140 is disposed over the back surface 114 of the semiconductor wafer 110 and fills the openings 130 according to a step 406 in FIG. 20, so that the active area 122 of the device chip 120 in contact with the protecting material 140, and a semiconductor package assembly 100 is formed. In some embodiments, the protecting material 140 includes polyimide.

Figure 17:
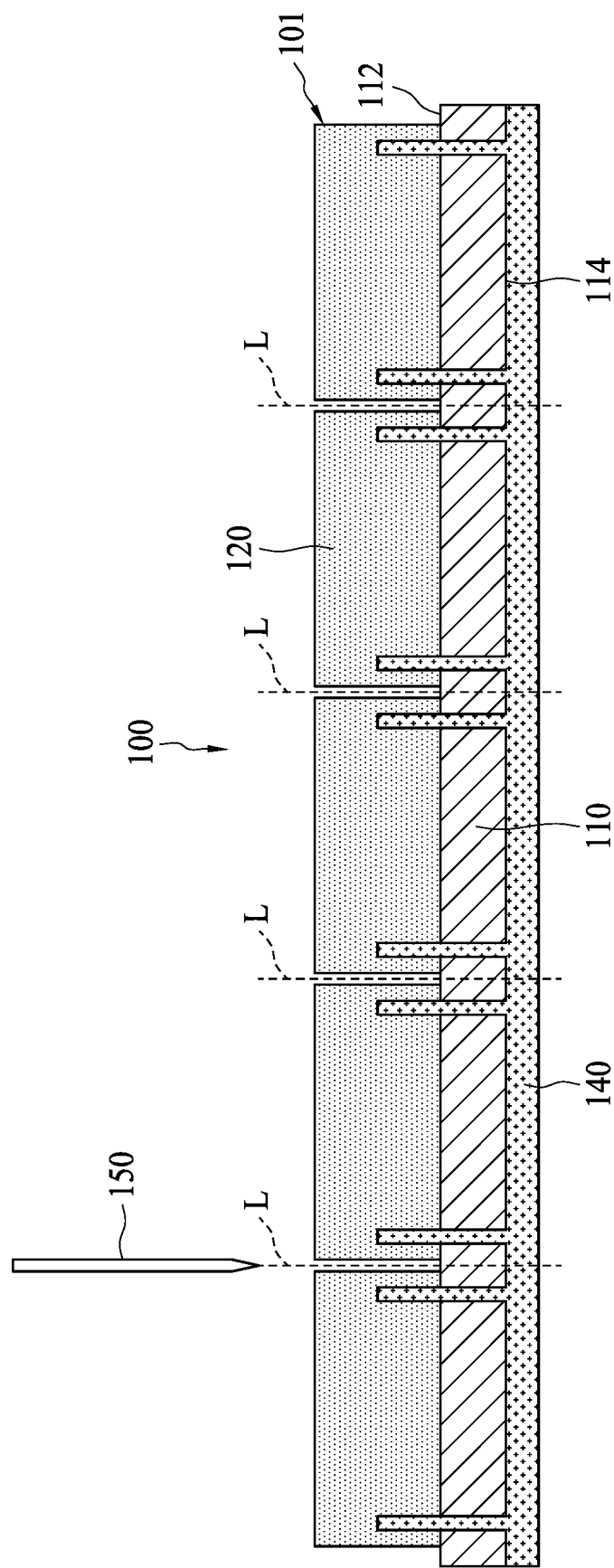
FIG. 17 illustrates a cross-sectional view of an intermediate stage in the formation of the semiconductor package in accordance with some embodiments of the present disclosure.
Figure 18:
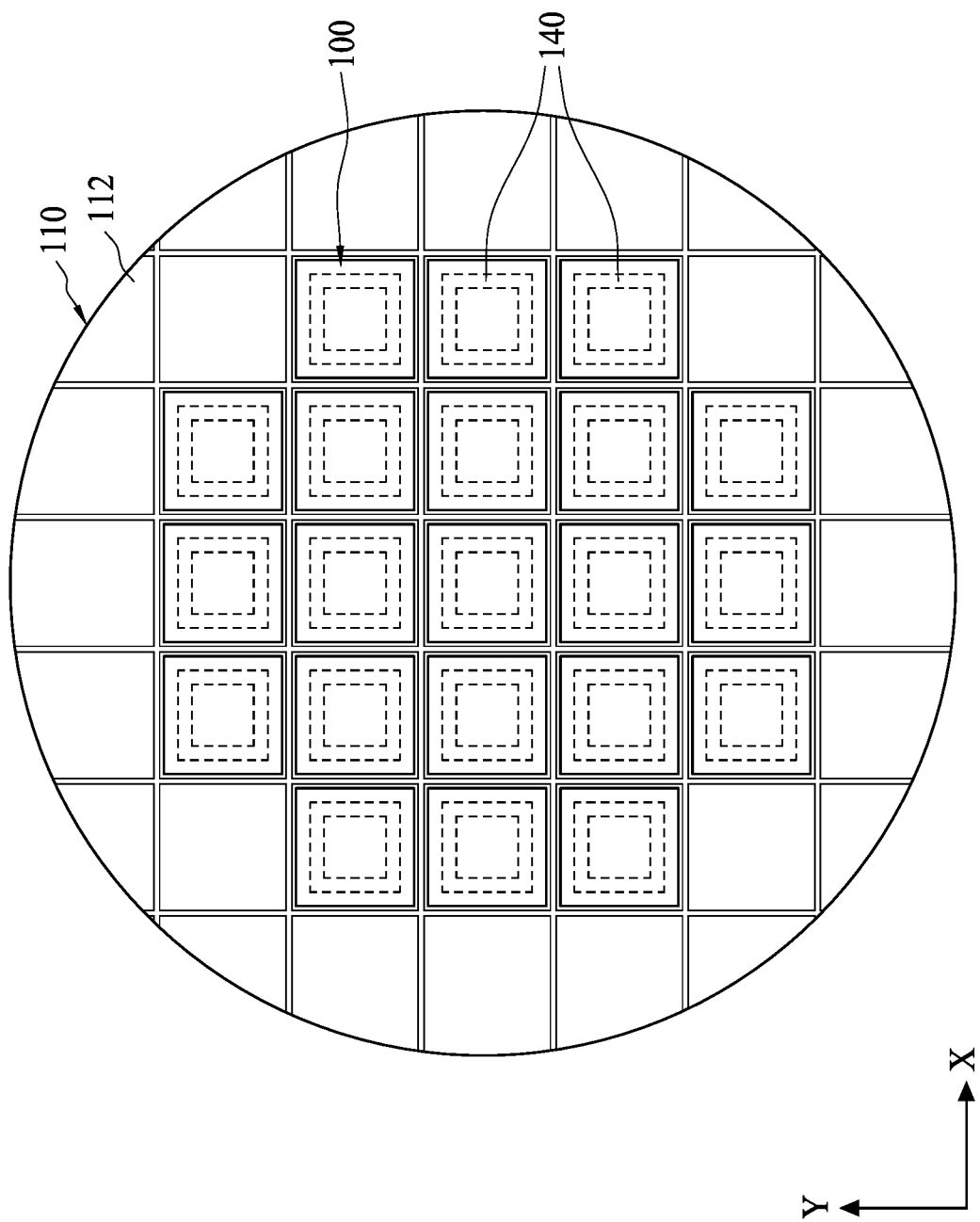
FIG. 18 illustrates a top view of an intermediate stage in the formation of the semiconductor package in accordance with some embodiments of the present disclosure.

Referring to FIGS. 17 and 18, semiconductor package assembly 100 is sawed apart into a plurality of semiconductor packages 102 according to a step 408 in FIG. 20, wherein each of the semiconductor packages 102 includes one of the device chip 120 and the corresponding semiconductor wafer 119 and protecting material 140. In some embodiments, the sawing step is performed, as shown in FIG. 17, using a saw blade 150. In some embodiments, the sawing is aligned with the sawing lines L. In some embodiments, the sawing step is performed from a front side 101 of the semiconductor package assembly 100. In some embodiments, after the sawing step, the semiconductor packages 102 on the left side of the illustrated sawing line L are fully separated from the semiconductor packages 102 on the right side of the illustrated sawing line L.

Figure 19:
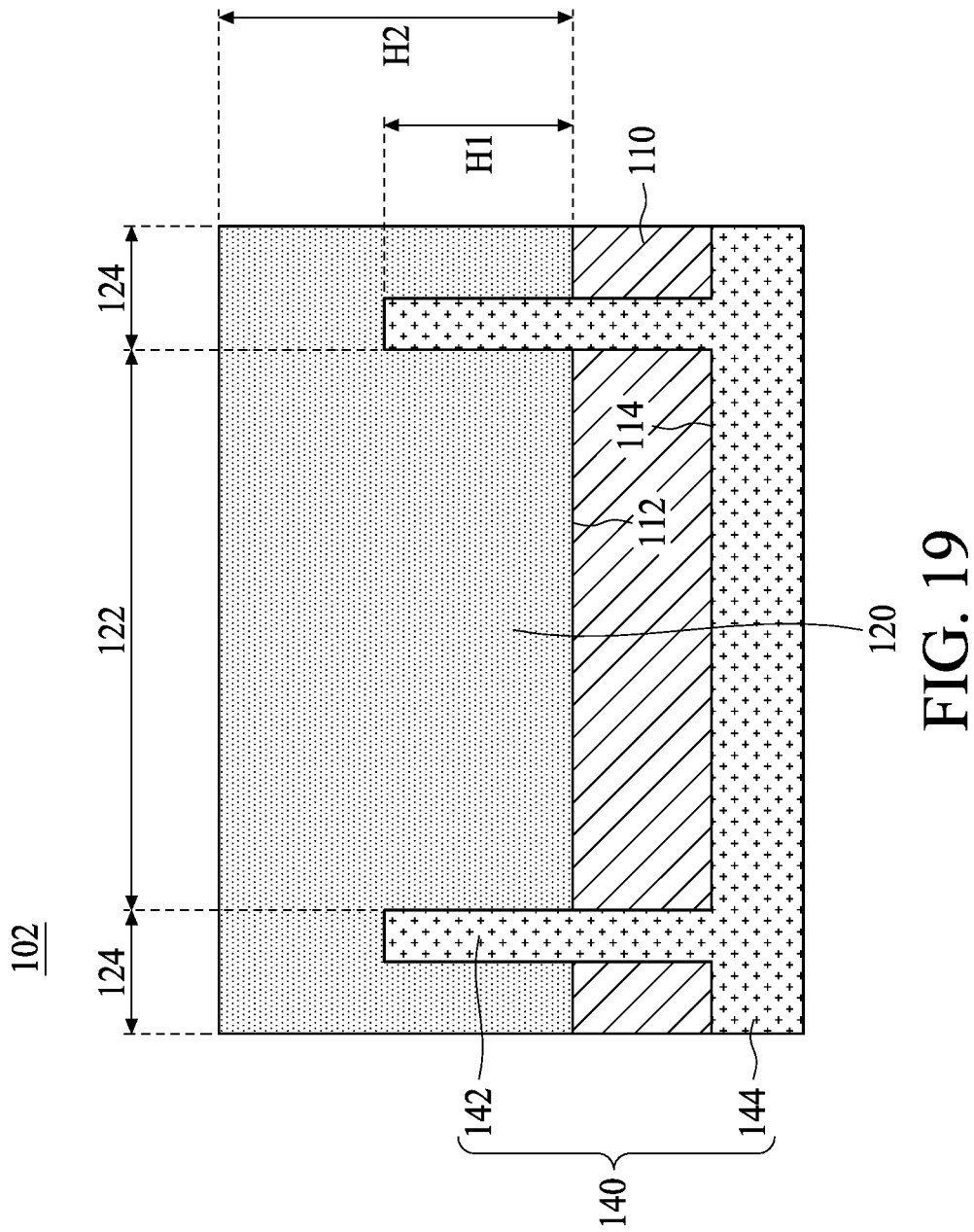
FIG. 19 illustrates a cross-sectional view of an intermediate stage in the formation of the semiconductor package in accordance with some embodiments of the present disclosure.

Referring to FIG. 19, the semiconductor package 102 includes a semiconductor wafer 110, a device chip 120, and a protection material 140. The device chip 120 has an active area 122 and an inactive area 124 arranged around the active area 122. The protecting material 140 includes a first portion 142 and a second portion 144 connected to the first portion 142; the first portion 142 is disposed within the semiconductor wafer 110 and the inactive area 124 and encircles the active area 122, and the second portion 144 is disposed over a back surface 114 of the semiconductor wafer 110.

In some embodiments, the first portion 142 and the second portion 144 are integrally formed. In some embodiments, a height H1 of the first portion 142 disposed within the inactive area 124 is substantially less than a height H2 of the device chip 120. In some embodiments, the protecting material 140 disposed within the inactive area 124 is in contact with the active area 122.

FIGS. 21 through 25B illustrate cross-sectional views of intermediate stages in the formation of a semiconductor package in accordance with some embodiments of the present disclosure. The steps shown in FIGS. 21 through 25B are also illustrated schematically in the process flow shown in FIG. 26. In the subsequent discussion, the process steps shown in FIGS. 21 through 25B are discussed in reference to the process steps in FIG. 26.

Figure 21:
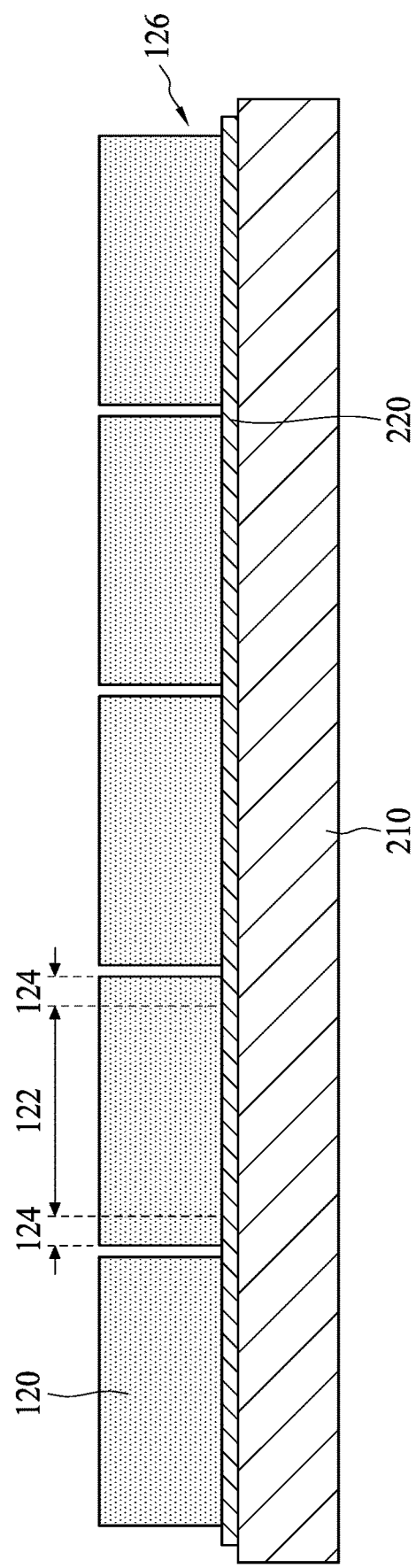
Figure 26:
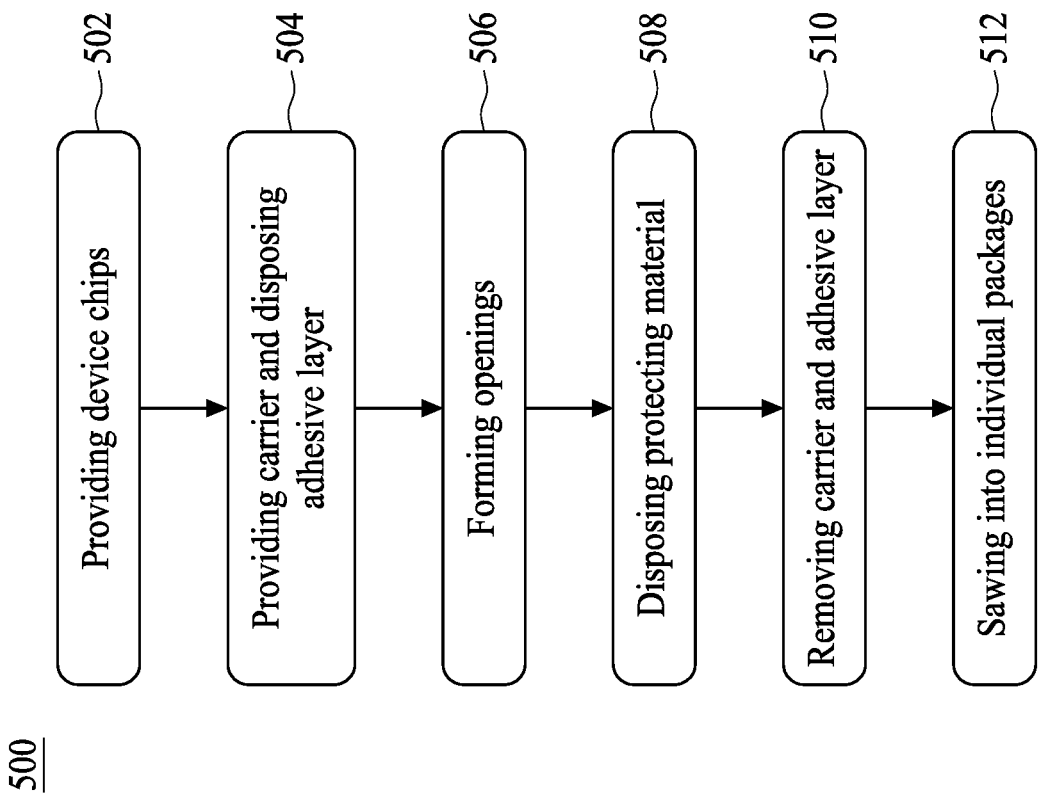
FIG. 26 illustrates a process flow for forming a semiconductor package in accordance with some embodiments of the present disclosure.

Referring to FIG. 21, a plurality of device chips 120 are provided according to a step 502 in FIG. 26. Each of the plurality of device chips 120 includes an active area 122 and an inactive area 124 arranged around the active area 122. Next, a carrier 210 and an adhesive layer 220 are provided according to a step 504 in FIG. 26. The adhesive layer 220 is disposed over the carrier 210. The device chips 120 are flipped upside down, so that front sides 126 of the device chips 120 face the adhesive layer 220. The front sides 126 of the device chips 120 are then in contact with the adhesive layer 220.

In some embodiments, the device chips 120 are arranged at regular intervals. In some embodiments, the active area 122 is a functional area of the device chip 120 that contains a plurality of layers or films formed by a series of process of steps including doping, deposition, photolithography, etching, and planarization, while the inactive area 124 is a non-functional area of the device chip 120 that contains one or more layers or films formed by one or more steps including doping, deposition, photolithography, etching, and planarization. In some embodiments, the carrier 210 is a blank glass carrier, a blank ceramic carrier, or the like, and has a round shape as viewed from above. In some embodiments, the adhesive layer 220 can be decomposed when exposed to heat or light, and hence the adhesive layer 150 can release the carrier 210 from the device chips 120.

Figure 22A:
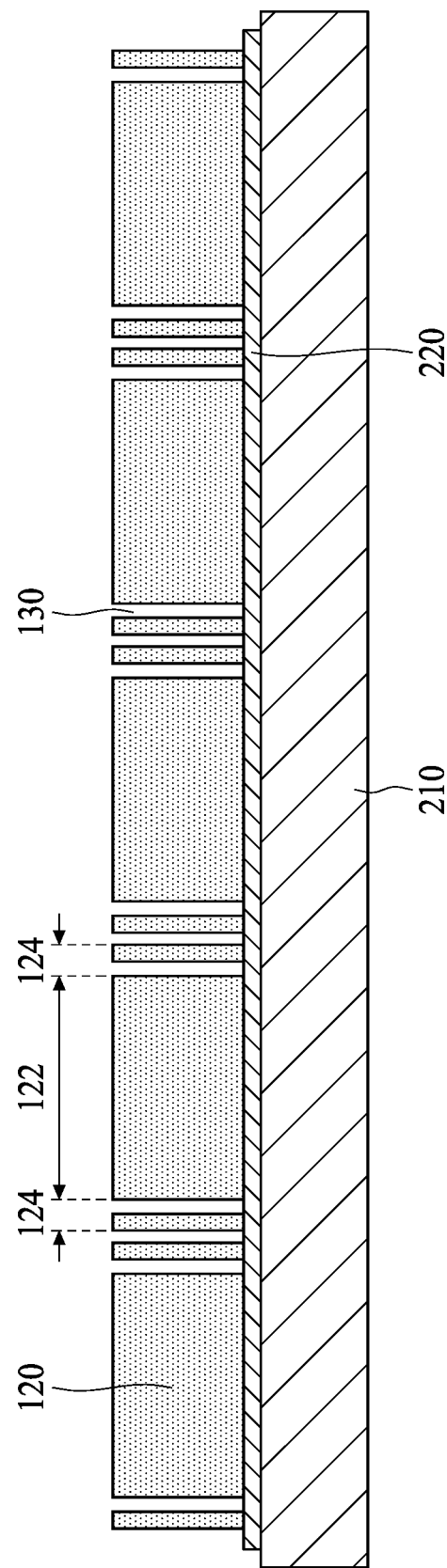
Figure 22B:
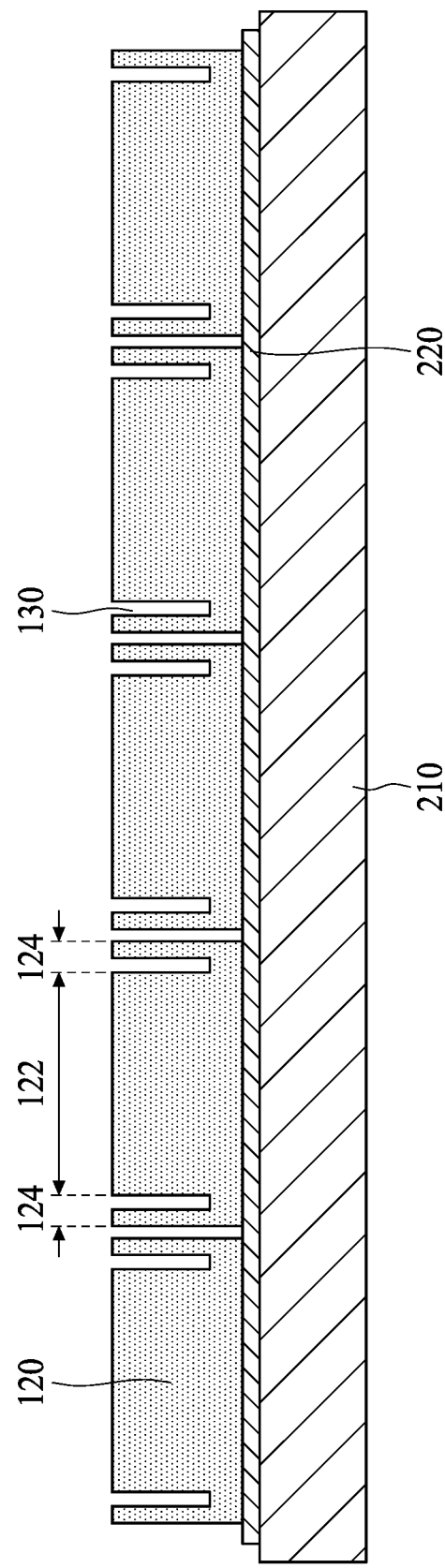

Referring to FIGS. 22A and 22B, a plurality of openings 130 are formed within the inactive area 124 of the device chip 120 according to a step 506 in FIG. 26. In FIG. 22A, portions of the adhesive layer 220 are exposed to the opening 130. In FIG. 22B, the adhesive layer 220 is not exposed to the opening 130.

In some embodiments, each of the plurality of openings 130 formed on the inactive area 124 surrounds the active area 122. In some embodiments, the active areas 122 are exposed to the openings 130. In some embodiments, the portions of the inactive area 124 of the device chips 120 are removed by photolithography and etching processes or any other suitable processes to form the openings 130.

Figure 23A:
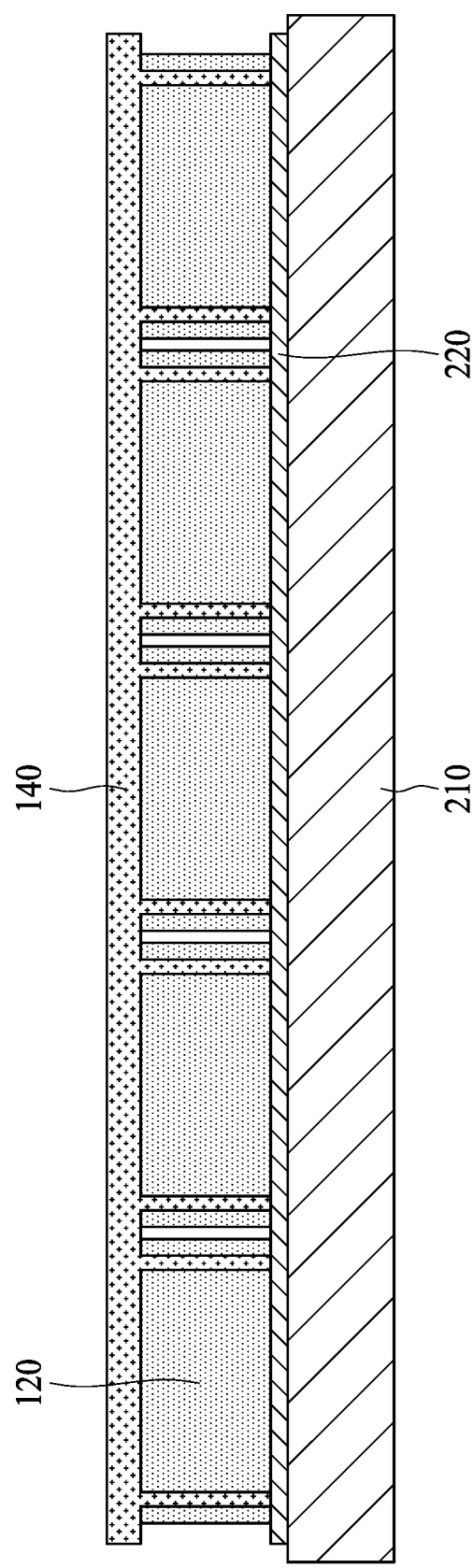
Figure 23B:
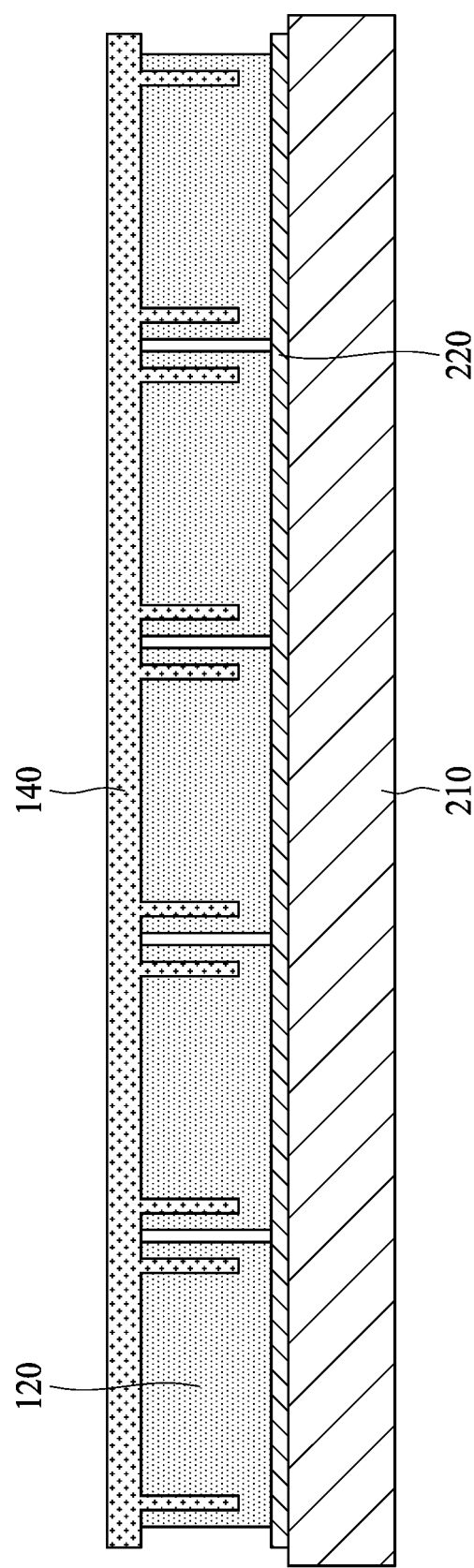

Referring to FIGS. 23A and 23B, a protecting material 140 is encapsulated on the lower surface of the device chip 120 and fills the openings 130 according to a step 508 in FIG. 26, so that the active area 122 of the device chip 120 is encapsulated by the protecting material 140, and a semiconductor package assembly 100 is formed. In some embodiments, the protecting material 140 disposed within the inactive area 124 is in contact with the active area 122. In some embodiments, the protecting material 140 disposed within the inactive area 124 is interfaced with the active area 122. Next, the carrier 210 is removed to form a semiconductor package assembly 100 according to a step 510 in FIG. 26.

Figure 24A:
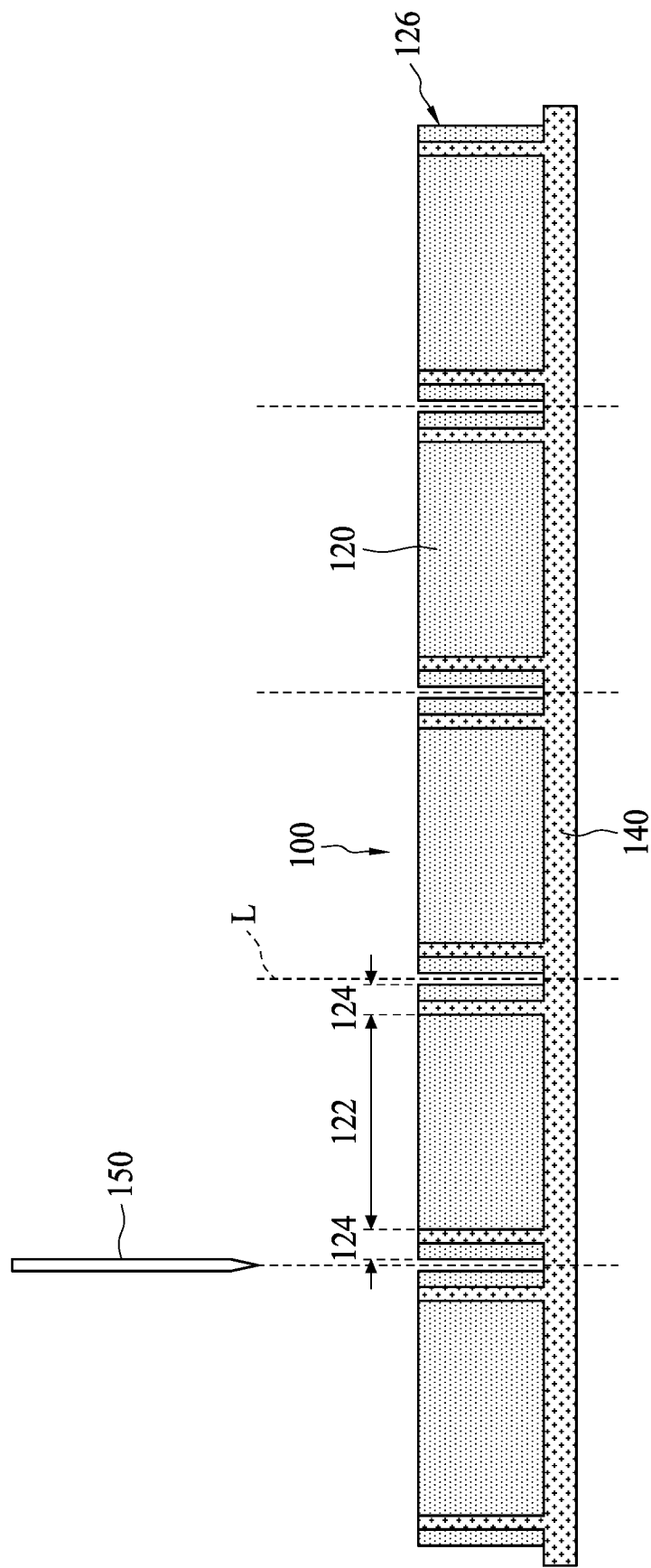
Figure 24B:
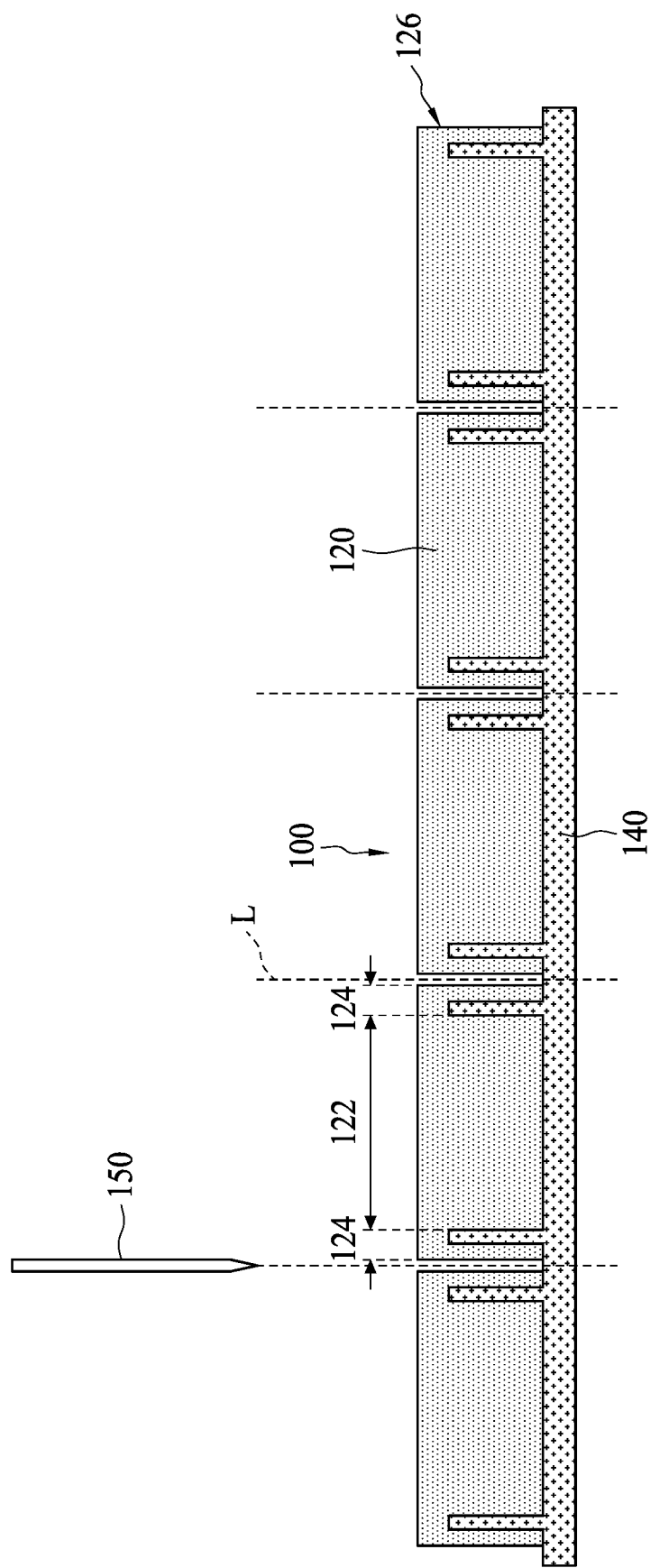

Referring to FIGS. 24A and 24B, the semiconductor package assembly 100 is sawed apart into a plurality of semiconductor packages 102 according to a step 512 in FIG. 26. Each of the semiconductor packages 102 includes one of the device chip 120 and the corresponding protecting material 140. In some embodiments, the sawing step is performed, as shown in FIGS. 24A and 24B, using a saw blade 150. In some embodiments, the sawing is aligned with the sawing lines L between two adjacent device chips 120. In some embodiments, the sawing step is performed from a front side 126 of the device chip 120. In some embodiments, after the sawing step, the semiconductor packages 102 on the left side of the illustrated sawing line L are fully separated from the semiconductor packages 102 on the right side of the illustrated sawing line L.

Referring to FIG. 25A, the semiconductor package 102 includes a device chip 120 and a protection material 140. The device chip 120 has an active area 122 and an inactive area 124 arranged around the active area 122. The protecting material 140 encapsulating the active area 122 includes a first portion 142 and a second portion 144; the first portion 142 is disposed within the inactive area 124, and the second portion 144 is disposed over a lower surface of device chip 120. A height H1 of the first portion 142 disposed within the inactive area 124 is substantially equal to a height H2 of the device chip 120.

In some embodiments, the first portion 142 and the second portion 144 are integrally formed. In some embodiments, the protecting material 140 disposed within the inactive area 124 is in contact with the active area 122. In some embodiments, the protecting material 140 disposed within the inactive area 124 is interfaced with the active area 122.

Figure 25B:
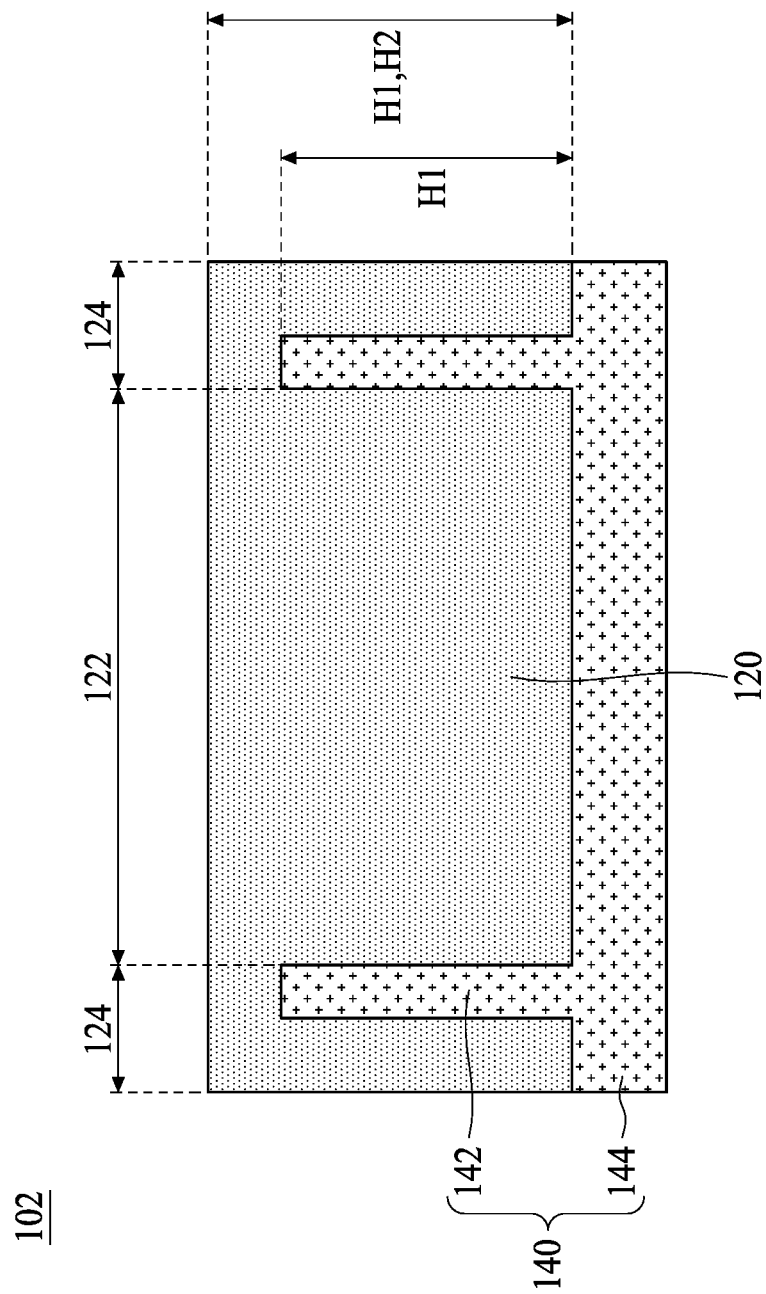

Referring to FIG. 25B, the semiconductor package 102 includes a device chip 120 and a protection material 140. The device chip 120 has an active area 122 and an inactive area 124 arranged around the active area 122. The protecting material 140 includes a first portion 142 and a second portion 144; the first portion 142 is disposed within the inactive area 124 and encircles the active area 122, and the second portion 144 is disposed on a back surface 114 of the semiconductor wafer 110. A height H1 of the first portion 142 disposed within the inactive area 124 is substantially less than a height H2 of the device chip 120.

In some embodiments, the first portion 142 and the second portion 144 are integrally formed. In some embodiments, the protecting material 140 disposed within the inactive area 124 is in contact with the active area 122. In some embodiments, the second portion 144 fully covers the lower surface.

One aspect of the present disclosure provides a semiconductor package. The semiconductor package includes a device chip and a protecting material. The device chip has an active area and an inactive area arranged around the active area. The protecting material includes a first portion and a second portion; the first portion is disposed within the inactive area and encircles the active area, and the second portion is disposed over a lower surface of the device chip and connected to the first portion.

One aspect of the present disclosure provides a semiconductor package assembly. The semiconductor package assembly includes a semiconductor wafer, a plurality of device chips, and a protecting material. The device chips are disposed on a front surface of the semiconductor wafer, and each of the plurality of device chips includes an active area and an inactive area arranged around the active area. The protecting material includes a first portion and a second portion connected to the first portion; the first portion is disposed within the semiconductor wafer and the inactive area and encircles the active area, and the second portion is disposed over a back surface of the semiconductor wafer and is connected to the first portion.

One aspect of the present disclosure provides a method for manufacturing a semiconductor package. The method for manufacturing a semiconductor package includes steps of providing a device chip, wherein the device chip has an active area and an inactive area arranged around the active area; forming an opening within the inactive area in a lower surface of the device chip; and disposing a protecting material within the opening and over the lower surface of the device chip.

One aspect of the present disclosure provides a method for manufacturing a semiconductor package assembly. The method includes steps of providing semiconductor wafer having a plurality of device chips disposed thereon, wherein each of the plurality of device chips has an active area and an inactive area arranged around the active area; forming a plurality of the openings, wherein each of the plurality of openings is formed in a back surface of the semiconductor wafer and forms an opening into the inactive area; and disposing a protecting material within the openings and over the back surface of the semiconductor wafer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package, comprising:
 a device chip having an active area and an inactive area arranged around the active area, wherein the active area is a functional area of the device chip and the inactive area is a non-functional area of the device chip; and
 a protecting material comprising:
 a first portion disposed within the device chip in the inactive area and encircling the active area, wherein the first portion of the protecting material is interfaced between the device chip in the active area and the device chip in the inactive area; and
 a second portion disposed over a lower surface of the device chip and in contact with the first portion.

2. The semiconductor package of claim 1, wherein a height of the first portion disposed within the inactive area is substantially equal to a height of the device chip.

3. The semiconductor package of claim 1, wherein a height of the first portion disposed within the inactive area is less than a height of the device chip.

4. The semiconductor package of claim 1, wherein the first portion and the second portion are integrally formed.

5. The semiconductor package of claim 1, wherein the first portion disposed within the inactive area is in contact with the active area.

6. The semiconductor package of claim 1, wherein the second portion fully covers the lower surface of the device chip.

7. The semiconductor package of claim 1, further comprising:
   a semiconductor wafer, wherein the device chip is disposed on a front surface of the semiconductor wafer, the first portion is disposed within the semiconductor wafer, and the second portion is disposed on a back surface opposite to the front surface of the semiconductor wafer.

8. The semiconductor package of claim 7, wherein the second portion fully covers the back surface.

* * * * *